US012560746B2

(12) United States Patent
Elabbasi et al.

(10) Patent No.: US 12,560,746 B2
(45) Date of Patent: Feb. 24, 2026

(54) BI-CYLINDRICAL PIEZOELECTRIC ACTUATED OPTICAL LENS

(71) Applicant: Meta Platforms Technologies, LLC, Menlo Park, CA (US)

(72) Inventors: Nagi Elabbasi, Southborough, MA (US); Christopher Yuan Ting Liao, Seattle, WA (US); Jonathan Robert Peterson, Woodinville, WA (US); Sheng Ye, Redmond, WA (US); Eugene Cho, Seattle, WA (US); Spencer Allan Wells, Seattle, WA (US); Andrew John Ouderkirk, Kirkland, WA (US); Emma Mullen, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 582 days.

(21) Appl. No.: 18/077,478

(22) Filed: Dec. 8, 2022

(65) Prior Publication Data

US 2024/0094445 A1 Mar. 21, 2024

Related U.S. Application Data

(60) Provisional application No. 63/407,032, filed on Sep. 15, 2022.

(51) Int. Cl.
*G02B 3/14* (2006.01)
*G02B 1/06* (2006.01)
(Continued)

(52) U.S. Cl.
CPC .................. *G02B 3/14* (2013.01); *G02B 1/06* (2013.01); *G02B 26/004* (2013.01); (Continued)

(58) Field of Classification Search
CPC .......... G02B 3/14; G02B 1/06; G02B 26/004; G02B 27/0093; G02B 27/0172; (Continued)

(56) References Cited

U.S. PATENT DOCUMENTS

| 8,717,681 B2 | 5/2014 | Griffith et al. |
| 10,001,629 B2 | 6/2018 | Craen et al. |

(Continued)

FOREIGN PATENT DOCUMENTS

WO WO-2022032198 A1 * 2/2022 ......... G02B 27/0172

OTHER PUBLICATIONS

European Search Report for European Patent Application No. 23194631.0, dated Feb. 6, 2024, 5 pages.

*Primary Examiner* — Mariam Qureshi
(74) *Attorney, Agent, or Firm* — Greenberg Traurig, LLP

(57) ABSTRACT

A liquid lens with flexible transparent active layers on both sides of a fluid is transformed along two distinct deformation axes. The flexible transparent active layers include piezoelectric materials that actuate the lens in response to applied voltage(s). The piezoelectric properties and actuation mechanism of the transparent layers are arranged to deform the lens cylindrically along different axes resulting in a net spherical deformation or a combination of spherical and cylindrical deformation with substantially less distortion than spherically deforming layers. The piezoelectric active layers may be polymer or ceramic with isotropic or aniso-tropic mechanical stiffness. Alternatively, a pair of transpar-ent, internal layers are positioned between the front and rear surfaces. The active layers, front and/or rear, are dual layers affixed together with an adhesive or single layers.

19 Claims, 28 Drawing Sheets

(51) Int. Cl.

| | |
|---|---|
| *G02B 26/00* | (2006.01) |
| *G02B 27/00* | (2006.01) |
| *G02B 27/01* | (2006.01) |
| *H10N 30/20* | (2023.01) |
| *H10N 30/857* | (2023.01) |

(52) U.S. Cl.
CPC ..... *G02B 27/0093* (2013.01); *G02B 27/0172* (2013.01); *H10N 30/206* (2023.02); *H10N 30/857* (2023.02); *G02B 2027/0138* (2013.01); *G02B 2027/0178* (2013.01)

(58) Field of Classification Search
CPC .... G02B 2027/0138; G02B 2027/0178; H10N 30/206; H10N 30/857; G02C 7/086; G02C 7/085
See application file for complete search history.

(56) References Cited

U.S. PATENT DOCUMENTS

| | | | |
|---|---|---|---|
| 10,634,824 B1 | 4/2020 | Ouderkirk et al. | |
| 10,838,116 B2 | 11/2020 | Mastrangelo et al. | |
| 11,175,435 B1 | 11/2021 | Ye et al. | |
| 2018/0175821 A1* | 6/2018 | Sadhu | H03H 3/02 |
| 2020/0201112 A1 | 6/2020 | De Smet et al. | |
| 2022/0271214 A1 | 8/2022 | Ouderkirk et al. | |
| 2025/0097629 A1* | 3/2025 | Miyoshi | H04R 1/24 |

* cited by examiner

500A

502

504

514

512

509

506

508

510

500B

600

REAR
SURFACE
LAYERS
604

FRONT
SURFACE
LAYERS
602

900A

900B

1000A

1000B

1000D

1100A

1100B

1300A

1300D

1338

1336

1334

1332

1400

AFFIX TWO OR MORE PIEZOELECTRIC LAYERS WITH ADHESIVE
1402

PROVIDE ELECTRODES FOR THE PIEZOELECTRIC LAYERS TO FORM AN ACTIVE LAYER
1404

AFFIX TWO ACTIVE LAYERS ON FRONT AND REAR SURFACES OF A LENS FLUID CONTAINER ("BAG")
1406

INSERT ONE OR MORE RIGID SURFACES BETWEEN TWO FLUID BAGS FOR SUPPORT
1408

BI-CYLINDRICAL PIEZOELECTRIC ACTUATED OPTICAL LENS

CROSS REFERENCE TO RELATED APPLICATIONS

This patent application claims the benefit of U.S. Provisional Patent Application Ser. No. 63/407,032 filed on Sep. 15, 2022. The disclosures of the above application are hereby incorporated by reference for all purposes.

TECHNICAL FIELD

This patent application relates generally to transformable optical lenses, and more specifically, to a liquid lens with flexible transparent piezoelectric layers on both sides of a fluid, where the layers are deformed cylindrically along different axes.

BACKGROUND

With recent advances in technology, prevalence and proliferation of content creation and delivery has increased greatly in recent years. In particular, interactive content such as virtual reality (VR) content, augmented reality (AR) content, mixed reality (MR) content, and content within and associated with a real and/or virtual environment (e.g., a "metaverse") has become appealing to consumers.

To facilitate delivery of this and other related content, service providers have endeavored to provide various forms of wearable display systems. One such example may be a head-mounted display (HMD) device, such as a wearable eyewear, a wearable headset, or eyeglasses. In some examples, the head-mounted display (HMD) device may project or direct light to may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment. Due to size, weight, and user comfort constraints, a number, size, and weight of individual components in a head-mounted display (HMD) device may present a challenge.

BRIEF DESCRIPTION OF DRAWINGS

Features of the present disclosure are illustrated by way of example and not limited in the following figures, in which like numerals indicate like elements. One skilled in the art will readily recognize from the following that alternative examples of the structures and methods illustrated in the figures can be employed without departing from the principles described herein.

DETAILED DESCRIPTION

Figure 1:
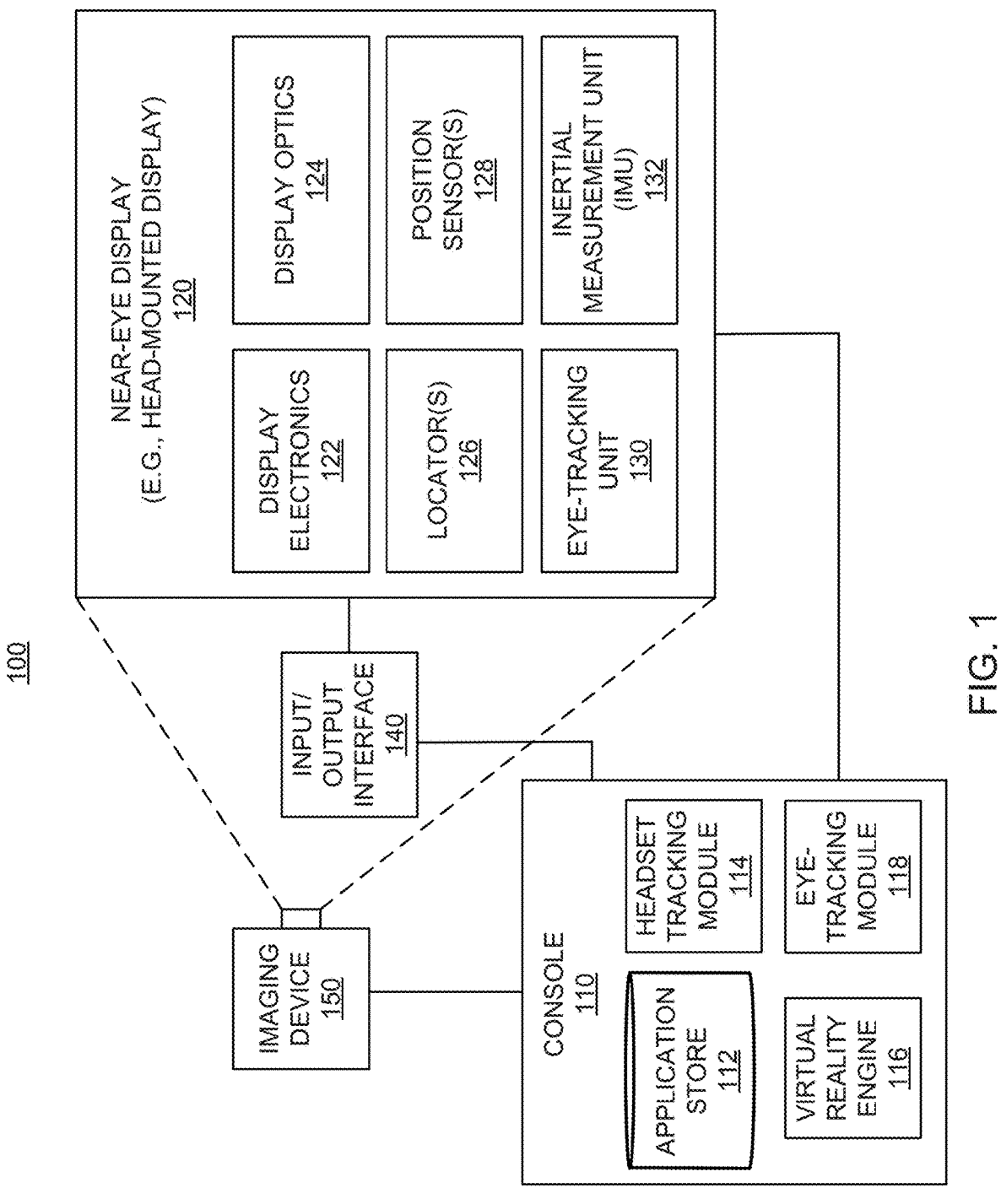
FIG. 1 illustrates a block diagram of an artificial reality system environment including a near-eye display, according to an example.

For simplicity and illustrative purposes, the present application is described by referring mainly to examples thereof. In the following description, numerous specific details are set forth in order to provide a thorough understanding of the present application. It will be readily apparent, however, that the present application may be practiced without limitation to these specific details. In other instances, some methods and structures readily understood by one of ordinary skill in the art have not been described in detail so as not to unnecessarily obscure the present application. As used herein, the terms "a" and "an" are intended to denote at least one of a particular element, the term "includes" means includes but not limited to, the term "including" means including but not limited to, and the term "based on" means based at least in part on.

As mentioned herein, size and weight limitations and close distance to the eye in head-mounted display (HMD) devices may impose requirements on various optical components that may be difficult to achieve. For example, high optical powers may be needed. Furthermore, components with adjustable characteristics (e.g., focus) may be needed to replace multiple components (e.g., lenses). Liquid lenses that can quickly adjust their focus may be a preferable component for head-mounted display (HMD) devices. Liquid lenses may be small, mechanically or electrically controlled cells containing an optical liquid. When a current or voltage is applied to a liquid lens cell, a shape of the cell may change causing the lens's optical power, and therefore focal length to shift.

While liquid lenses may operate through a variety of processes such as electrowetting, current-driven polymer, or sound piezoelectric, a number of challenges remain with designing liquid lenses. For example, retaining a spherical shape (contour) of the lens at different settings may be difficult to achieve. Irregularities on the surface at various diopter levels may prevent consistent performance. Moreover, to obtain a spherical shape, complex actuation systems and high power consumption may be needed.

In some examples of the present disclosure, a liquid lens with flexible transparent active layers on both sides of a fluid may be transformed along two distinct deformation axes. The flexible transparent active layers may be piezoelectric materials that actuate the lens in response to applied voltage(s). The piezoelectric properties and actuation mechanism of the transparent layers may be arranged to deform the lens cylindrically along different axes resulting in a net spherical deformation or a combination of spherical and cylindrical deformation with substantially less distortion than spherically deforming layers. An outcome of the dual cylindrical deformation may be that substantially higher optical power may be achieved for the liquid lens. For example, 30 diopters or more may be reached without mechanical stability problems. The liquid lens may also be less sensitive to high aspect ratio lens geometries, and to other non-circular lens geometries.

In some examples, the piezoelectric active layers may be polymer or ceramic with isotropic or anisotropic mechanical stiffness. Front and rear active layers may be made using similar or different materials. In some implementations, a pair of transparent, internal layers may be positioned between the front and rear surfaces. The active layers, front and/or rear, may be dual layers affixed together with an adhesive or single layers.

Examples are discussed herein in conjunction with head-mounted display device or near-eye display device implementations. However, a bi-cylindrical piezoelectric actuated lens as described herein may be implemented in other environments such as machine vision, microscopy applications, measurement and dimensional rendering, unmanned aerial vehicle (UAV) based optical systems, and comparable ones using the principles discussed herein. Other applications may include any variable focus optical device such as variable focus cameras, and variable focus glasses.

While some advantages and benefits of the present disclosure are apparent, other advantages and benefits may include lower power, lighter weight, and/or smaller size transformable optical lens. High optical power values may be reached without mechanical stability problems. The liquid lens may require lower voltage to actuate and generate lower stresses in the lens material.

FIG. 1 illustrates a block diagram of an artificial reality system environment 100 including a near-eye display, according to an example. As used herein, a "near-eye display" may refer to a device (e.g., an optical device) that may be in close proximity to a user's eye. As used herein, "artificial reality" may refer to aspects of, among other things, a "metaverse" or an environment of real and virtual elements and may include use of technologies associated with virtual reality (VR), augmented reality (AR), and/or mixed reality (MR). As used herein a "user" may refer to a user or wearer of a "near-eye display."

As shown in FIG. 1, the artificial reality system environment 100 may include a near-eye display 120, an optional external imaging device 150, and an optional input/output interface 140, each of which may be coupled to a console 110. The console 110 may be optional in some instances as the functions of the console 110 may be integrated into the near-eye display 120. In some examples, the near-eye display 120 may be a head-mounted display (HMD) that presents content to a user.

In some instances, for a near-eye display system, it may generally be desirable to expand an eye box, reduce display haze, improve image quality (e.g., resolution and contrast), reduce physical size, increase power efficiency, and increase or expand field of view (FOV). As used herein, "field of view" (FOV) may refer to an angular range of an image as seen by a user, which is typically measured in degrees as observed by one eye (for a monocular head-mounted display (HMD)) or both eyes (for binocular head-mounted displays (HMDs)). Also, as used herein, an "eye box" may be a two-dimensional box that may be positioned in front of the user's eye from which a displayed image from an image source may be viewed.

In some examples, in a near-eye display system, light from a surrounding environment may traverse a "see-through" region of a waveguide display (e.g., a transparent substrate) to reach a user's eyes. For example, in a near-eye display system, light of projected images may be coupled into a transparent substrate of a waveguide, propagate within the waveguide, and be coupled or directed out of the waveguide at one or more locations to replicate exit pupils and expand the eye box.

In some examples, the near-eye display 120 may include one or more rigid bodies, which may be rigidly or non-rigidly coupled to each other. In some examples, a rigid coupling between rigid bodies may cause the coupled rigid bodies to act as a single rigid entity, while in other examples, a non-rigid coupling between rigid bodies may allow the rigid bodies to move relative to each other.

In some examples, the near-eye display 120 may be implemented in any suitable form-factor, including a head-mounted display (HMD), a pair of glasses, or other similar wearable eyewear or device. Examples of the near-eye display 120 are further described below with respect to FIGS. 2 and 3. Additionally, in some examples, the functionality described herein may be used in a head-mounted display (HMD) or headset that may combine images of an environment external to the near-eye display 120 and artificial reality content (e.g., computer-generated images). Therefore, in some examples, the near-eye display 120 may augment images of a physical, real-world environment external to the near-eye display 120 with generated and/or overlaid digital content (e.g., images, video, sound, etc.) to present an augmented reality to a user.

In some examples, the near-eye display 120 may include any number of display electronics 122, display optics 124, and an eye tracking unit 130. In some examples, the near-eye display 120 may also include one or more locators 126, one or more position sensors 128, and an inertial measurement unit (IMU) 132. In some examples, the near-eye display 120 may omit any of the eye tracking unit 130, the one or more locators 126, the one or more position sensors 128, and the inertial measurement unit (IMU) 132, or may include additional elements.

In some examples, the display electronics 122 may display or facilitate the display of images to the user according to data received from, for example, the optional console 110. In some examples, the display electronics 122 may include one or more display panels. In some examples, the display electronics 122 may include any number of pixels to emit light of a predominant color such as red, green, blue, white, or yellow. In some examples, the display electronics 122 may display a three-dimensional (3D) image, e.g., using stereoscopic effects produced by two-dimensional panels, to create a subjective perception of image depth.

In some examples, the display optics 124 may display image content optically (e.g., using optical waveguides and/or couplers) or magnify image light received from the display electronics 122, correct optical errors associated with the image light, and/or present the corrected image light to a user of the near-eye display 120. In some examples, the display optics 124 may include a single optical element or any number of combinations of various optical elements as well as mechanical couplings to maintain relative spacing and orientation of the optical elements in the combination. For example, display optics 124 may include a bi-cylindrical, piezoelectric actuated deformable liquid lens. Electronic control of deformation may be managed by one or more circuits in the display electronics 122 or by a module in the console 110. In some examples, one or more optical elements in the display optics 124 may have an optical coating, such as an anti-reflective coating, a reflective coating, a filtering coating, and/or a combination of different optical coatings.

In some examples, the display optics 124 may also be designed to correct one or more types of optical errors, such as two-dimensional optical errors, three-dimensional optical errors, or any combination thereof. Examples of two-dimensional errors may include barrel distortion, pincushion distortion, longitudinal chromatic aberration, and/or transverse chromatic aberration. Examples of three-dimensional errors may include spherical aberration, chromatic aberration field curvature, and astigmatism.

In some examples, the one or more locators 126 may be objects located in specific positions relative to one another and relative to a reference point on the near-eye display 120. In some examples, the optional console 110 may identify the one or more locators 126 in images captured by the optional external imaging device 150 to determine the artificial reality headset's position, orientation, or both. The one or more locators 126 may each be a light-emitting diode (LED), a corner cube reflector, a reflective marker, a type of light source that contrasts with an environment in which the near-eye display 120 operates, or any combination thereof.

In some examples, the external imaging device 150 may include one or more cameras, one or more video cameras, any other device capable of capturing images including the one or more locators 126, or any combination thereof. The optional external imaging device 150 may be configured to detect light emitted or reflected from the one or more locators 126 in a field of view of the optional external imaging device 150.

In some examples, the one or more position sensors 128 may generate one or more measurement signals in response to motion of the near-eye display 120. Examples of the one or more position sensors 128 may include any number of accelerometers, gyroscopes, magnetometers, and/or other motion-detecting or error-correcting sensors, or any combination thereof.

In some examples, the inertial measurement unit (IMU) 132 may be an electronic device that generates fast calibration data based on measurement signals received from the one or more position sensors 128. The one or more position sensors 128 may be located external to the inertial measurement unit (IMU) 132, internal to the inertial measurement unit (IMU) 132, or any combination thereof. Based on the one or more measurement signals from the one or more position sensors 128, the inertial measurement unit (IMU) 132 may generate fast calibration data indicating an estimated position of the near-eye display 120 that may be relative to an initial position of the near-eye display 120. For example, the inertial measurement unit (IMU) 132 may integrate measurement signals received from accelerometers over time to estimate a velocity vector and integrate the velocity vector over time to determine an estimated position of a reference point on the near-eye display 120. Alternatively, the inertial measurement unit (IMU) 132 may provide the sampled measurement signals to the optional console 110, which may determine the fast calibration data.

In some examples, the near-eye display 120 may use the orientation of the eye to introduce depth cues (e.g., blur image outside of the user's main line of sight), collect heuristics on the user interaction in the virtual reality (VR) media (e.g., time spent on any particular subject, object, or frame as a function of exposed stimuli), some other functions that are based in part on the orientation of at least one of the user's eyes, or any combination thereof. In some examples, because the orientation may be determined for both eyes of the user, the eye tracking unit 130 may be able to determine where the user is looking or predict any user patterns, etc.

In some examples, the input/output interface 140 may be a device that allows a user to send action requests to the optional console 110. As used herein, an "action request" may be a request to perform a particular action. For example, an action request may be to start or to end an application or to perform a particular action within the application. The input/output interface 140 may include one or more input devices. Example input devices may include a keyboard, a mouse, a game controller, a glove, a button, a touch screen, or any other suitable device for receiving action requests and communicating the received action requests to the optional console 110. In some examples, an action request received by the input/output interface 140 may be communicated to the optional console 110, which may perform an action corresponding to the requested action.

In some examples, the optional console 110 may provide content to the near-eye display 120 for presentation to the user in accordance with information received from one or more of external imaging device 150, the near-eye display 120, and the input/output interface 140. For example, in the example shown in FIG. 1, the optional console 110 may include an application store 112, a headset tracking module 114, a virtual reality engine 116, and an eye tracking module 118. Some examples of the optional console 110 may include different or additional modules than those described in conjunction with FIG. 1. Functions further described below may be distributed among components of the optional console 110 in a different manner than is described here.

In some examples, the optional console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In some examples, the modules of the optional console 110 described in conjunction with FIG. 1 may be encoded as instructions in the non-transitory computer-readable storage medium that, when executed by the processor, cause the processor to perform the functions further described below. It should be appreciated that the optional console 110 may or may not be needed or the optional console 110 may be integrated with or separate from the near-eye display 120.

In some examples, the application store 112 may store one or more applications for execution by the optional console 110. An application may include a group of instructions that, when executed by a processor, generates content for presentation to the user. Examples of the applications may include gaming applications, conferencing applications, video playback application, or other suitable applications.

In some examples, the headset tracking module 114 may track movements of the near-eye display 120 using slow calibration information from the external imaging device 150. For example, the headset tracking module 114 may determine positions of a reference point of the near-eye display 120 using observed locators from the slow calibration information and a model of the near-eye display 120. Additionally, in some examples, the headset tracking module 114 may use portions of the fast calibration information, the slow calibration information, or any combination thereof, to predict a future location of the near-eye display 120. In some examples, the headset tracking module 114 may provide the estimated or predicted future position of the near-eye display 120 to the virtual reality engine 116.

In some examples, the virtual reality engine 116 may execute applications within the artificial reality system environment 100 and receive position information of the near-eye display 120, acceleration information of the near-eye display 120, velocity information of the near-eye display 120, predicted future positions of the near-eye display 120, or any combination thereof from the headset tracking module 114. In some examples, the virtual reality engine 116 may also receive estimated eye position and orientation information from the eye tracking module 118. Based on the received information, the virtual reality engine 116 may determine content to provide to the near-eye display 120 for presentation to the user.

In some examples, the eye tracking module 118, which may be implemented as a processor, may receive eye tracking data from the eye tracking unit 130 and determine the position of the user's eye based on the eye tracking data. In some examples, the position of the eye may include an eye's orientation, location, or both relative to the near-eye display 120 or any element thereof. So, in these examples, because the eye's axes of rotation change as a function of the eye's location in its socket, determining the eye's location in its socket may allow the eye tracking module 118 to more accurately determine the eye's orientation.

In some examples, a location of a projector of a display system may be adjusted to enable any number of design modifications. For example, in some instances, a projector may be located in front of a viewer's eye (i.e., "front-mounted" placement). In a front-mounted placement, in some examples, a projector of a display system may be located away from a user's eyes (i.e., "world-side"). In some examples, a head-mounted display (HMD) device may utilize a front-mounted placement to propagate light towards a user's eye(s) to project an image.

Figure 2:
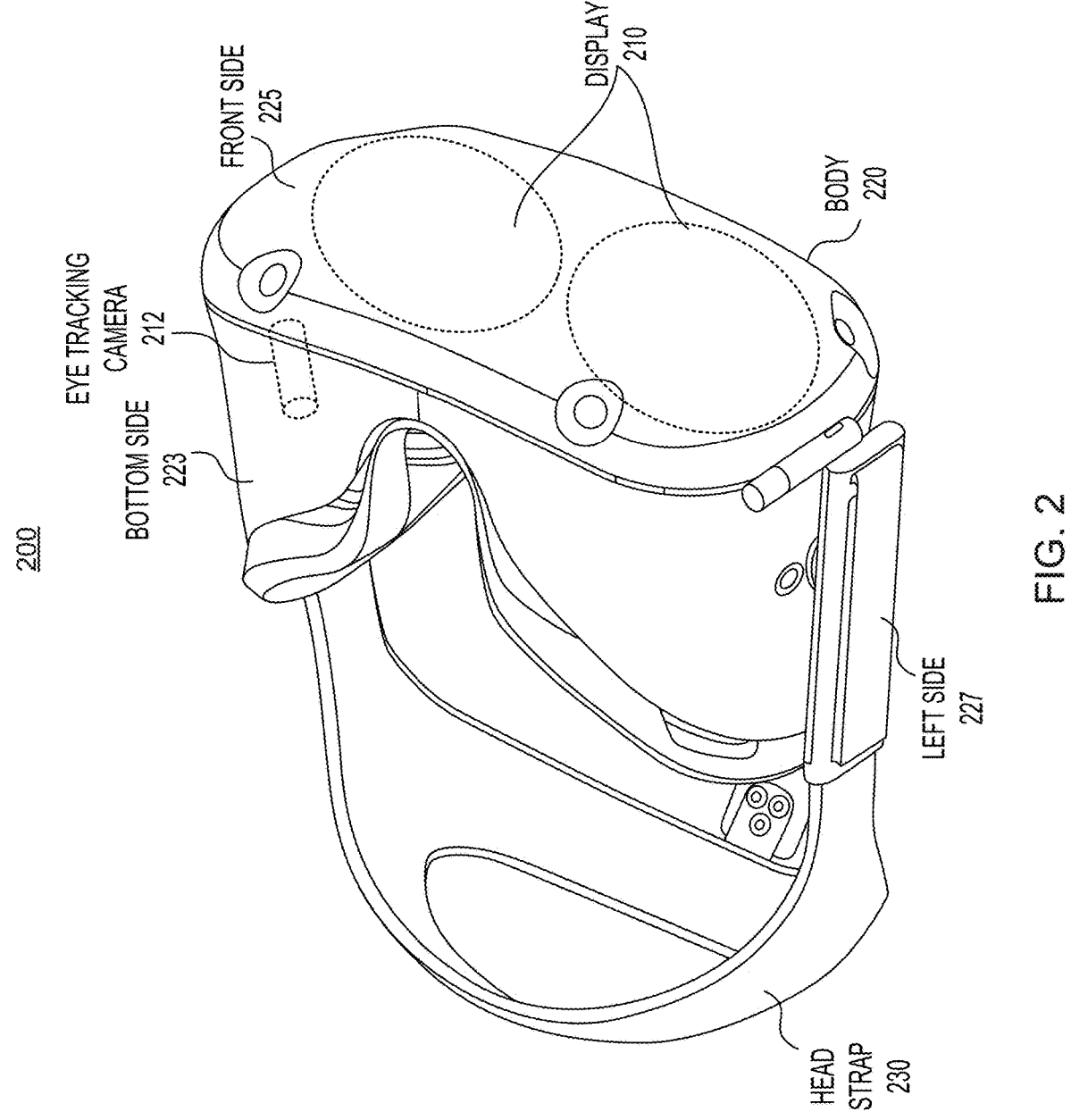
FIG. 2 illustrates a perspective view of a near-eye display in the form of a head-mounted display (HMD) device, according to an example.

FIG. 2 illustrates a perspective view of a near-eye display in the form of a head-mounted display (HMD) device 200, according to an example. In some examples, the head-mounted device (HMD) device 200 may be a part of a virtual reality (VR) system, an augmented reality (AR) system, a mixed reality (MR) system, another system that uses displays or wearables, or any combination thereof. In some examples, the head-mounted display (HMD) device 200 may include a body 220 and a head strap 230. FIG. 2 shows a bottom side 223, a front side 225, and a left side 227 of the body 220 in the perspective view. In some examples, the head strap 230 may have an adjustable or extendible length. In particular, in some examples, there may be a sufficient space between the body 220 and the head strap 230 of the head-mounted display (HMD) device 200 for allowing a user to mount the head-mounted display (HMD) device 200 onto the user's head. For example, the length of the head strap 230 may be adjustable to accommodate a range of user head sizes. In some examples, the head-mounted display (HMD) device 200 may include additional, fewer, and/or different components.

In some examples, the head-mounted display (HMD) device 200 may present to a user, media or other digital content including virtual and/or augmented views of a physical, real-world environment with computer-generated elements. Examples of the media or digital content presented by the head-mounted display (HMD) device 200 may include images (e.g., two-dimensional (2D) or three-dimensional (3D) images), videos (e.g., 2D or 3D videos), audio, or any combination thereof. In some examples, the images and videos may be presented to each eye of a user by one or more display assemblies (not shown in FIG. 2) enclosed in the body 220 of the head-mounted display (HMD) device 200.

In some examples, the head-mounted display (HMD) device 200 may include various sensors (not shown), such as depth sensors, motion sensors, position sensors, and/or eye tracking sensors. Some of these sensors may use any number of structured or unstructured light patterns for sensing purposes. In some examples, the head-mounted display (HMD) device 200 may include an input/output interface 140 for communicating with a console 110, as described with respect to FIG. 1. In some examples, the head-mounted display (HMD) device 200 may include a virtual reality engine (not shown), but similar to the virtual reality engine 116 described with respect to FIG. 1, that may execute applications within the head-mounted display (HMD) device 200 and receive depth information, position information, acceleration information, velocity information, predicted future positions, or any combination thereof of the head-mounted display (HMD) device 200 from the various sensors.

In some examples, the information received by the virtual reality engine 116 may be used for producing a signal (e.g., display instructions) to the one or more display assemblies. In some examples, the head-mounted display (HMD) device 200 may include locators (not shown), but similar to the virtual locators 126 described in FIG. 1, which may be located in fixed positions on the body 220 of the head-mounted display (HMD) device 200 relative to one another and relative to a reference point. Each of the locators may emit light that is detectable by an external imaging device. This may be useful for the purposes of head tracking or other movement/orientation. It should be appreciated that other elements or components may also be used in addition or in lieu of such locators.

It should be appreciated that in some examples, a projector mounted in a display system may be placed near and/or closer to a user's eye (i.e., "eye-side"). In some examples, and as discussed herein, a projector for a display system shaped liked eyeglasses may be mounted or positioned in a temple arm (i.e., a top far corner of a lens side) of the eyeglasses. It should be appreciated that, in some instances, utilizing a back-mounted projector placement may help to reduce size or bulkiness of any required housing required for a display system, which may also result in a significant improvement in user experience for a user.

In some examples, each of the display 210 may include a bi-cylindrical piezoelectric actuated lens with different deformation axes. Lens focus may be adjusted by actuating the piezoelectric layers and deforming the lens shape cylindrically along the two deformation axes. The piezoelectric layers may be controlled by electronics in the head-mounted display (HMD) device 200 or in an electrically coupled remote controller.

Figure 3A:
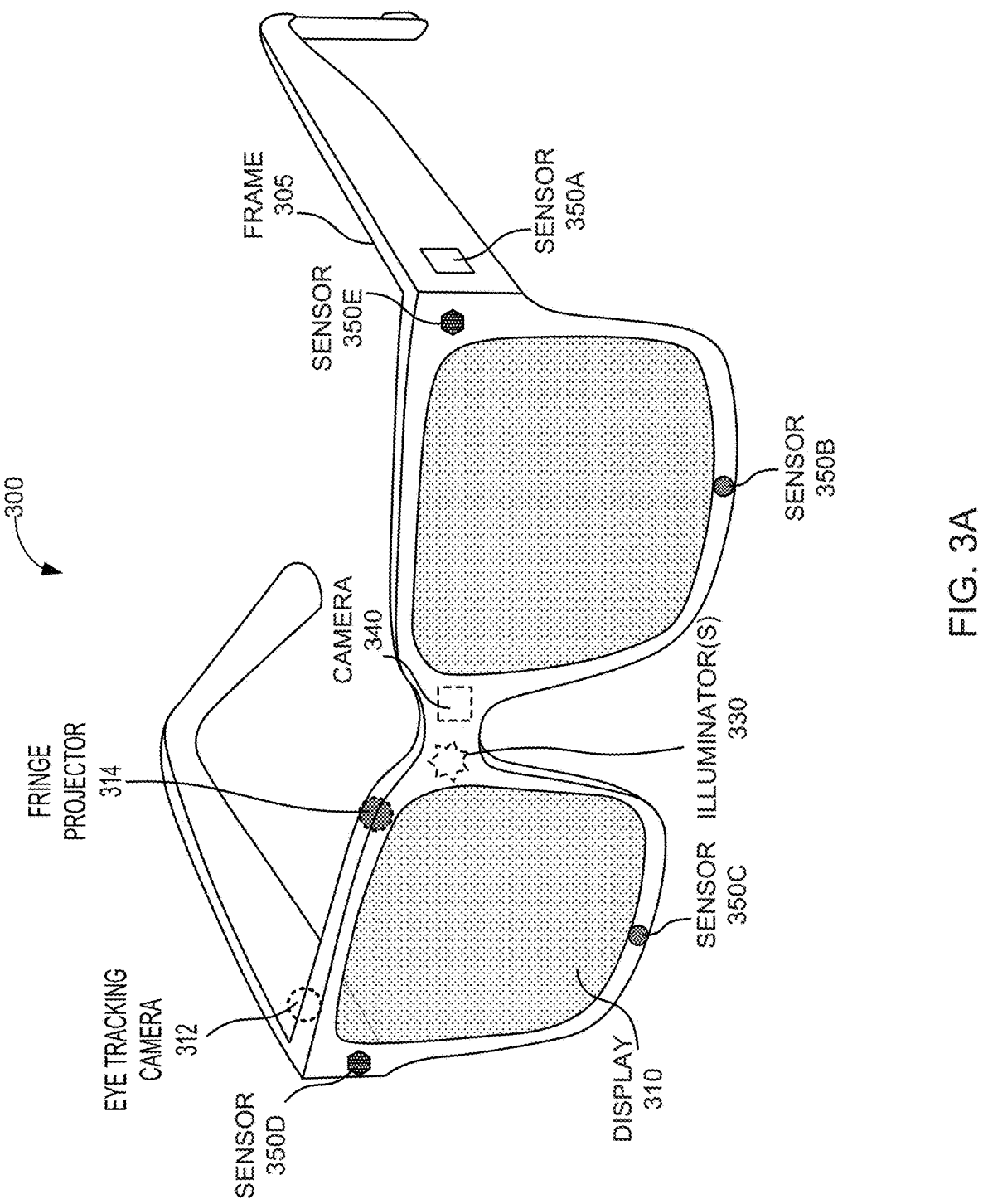
FIGS. 3A and 3B illustrate a perspective view and a top view of a near-eye display in the form of a pair of glasses, according to an example.

FIG. 3A is a perspective view of a near-eye display 300 in the form of a pair of glasses (or other similar eyewear), according to an example. In some examples, the near-eye display 300 may be a specific example of near-eye display 120 of FIG. 1 and may be configured to operate as a virtual reality display, an augmented reality (AR) display, and/or a mixed reality (MR) display.

In some examples, the near-eye display 300 may include temples 305 and a display 310. In some examples, the display 310 may be configured to present media or other content to a user. In some examples, the display 310 may include display electronics and/or display optics, similar to components described with respect to FIGS. 1-2. For example, as described above with respect to the near-eye display 120 of FIG. 1, the display 310 may include a liquid crystal display (LCD) display panel, a light-emitting diode (LED) display panel, or an optical display panel (e.g., a waveguide display assembly). In some examples, the display 310 may also include any number of optical components, such as waveguides, gratings, lenses, mirrors, etc. For example, the display 310 may include a bi-cylindrical piezoelectric actuated lens with different deformation axes. Lens focus may be adjusted by actuating the piezoelectric layers and deforming the lens shape cylindrically along the two deformation axes. In other examples, the display 310 may include a projector, or in place of the display 310 the near-eye display 300 may include a projector.

In some examples, the near-eye display 300 may further include various sensors 350a, 350b, 350c, 350d, and 350e on or within the temples 305. In some examples, the various sensors 350a-350e may include any number of depth sensors, motion sensors, position sensors, inertial sensors, and/or ambient light sensors, as shown. In some examples, the various sensors 350a-350e may include any number of image sensors configured to generate image data representing different fields of views in one or more different directions. In some examples, the various sensors 350a-350e may be used as input devices to control or influence the displayed content of the near-eye display, and/or to provide an interactive virtual reality (VR), augmented reality (AR), and/or mixed reality (MR) experience to a user of the near-eye display 300. In some examples, the various sensors 350a-350e may also be used for stereoscopic imaging or other similar application.

In some examples, the near-eye display 300 may further include one or more illuminators 330 to project light into a physical environment. The projected light may be associated with different frequency bands (e.g., visible light, infra-red light, ultra-violet light, etc.), and may serve various purposes. In some examples, the one or more illuminator(s) 330 may be used as locators, such as the one or more locators 126 described above with respect to FIGS. 1-2.

In some examples, the near-eye display 300 may also include a camera 340 or other image capture unit. The camera 340, for instance, may capture images of the physical environment in the field of view. In some instances, the captured images may be processed, for example, by a virtual reality engine (e.g., the virtual reality engine 116 of FIG. 1) to add virtual objects to the captured images or modify physical objects in the captured images, and the processed images may be displayed to the user by the display 310 for augmented reality (AR) and/or mixed reality (MR) applications. The near-eye display 300 may also include an eye tracking camera 312.

Figure 3B:
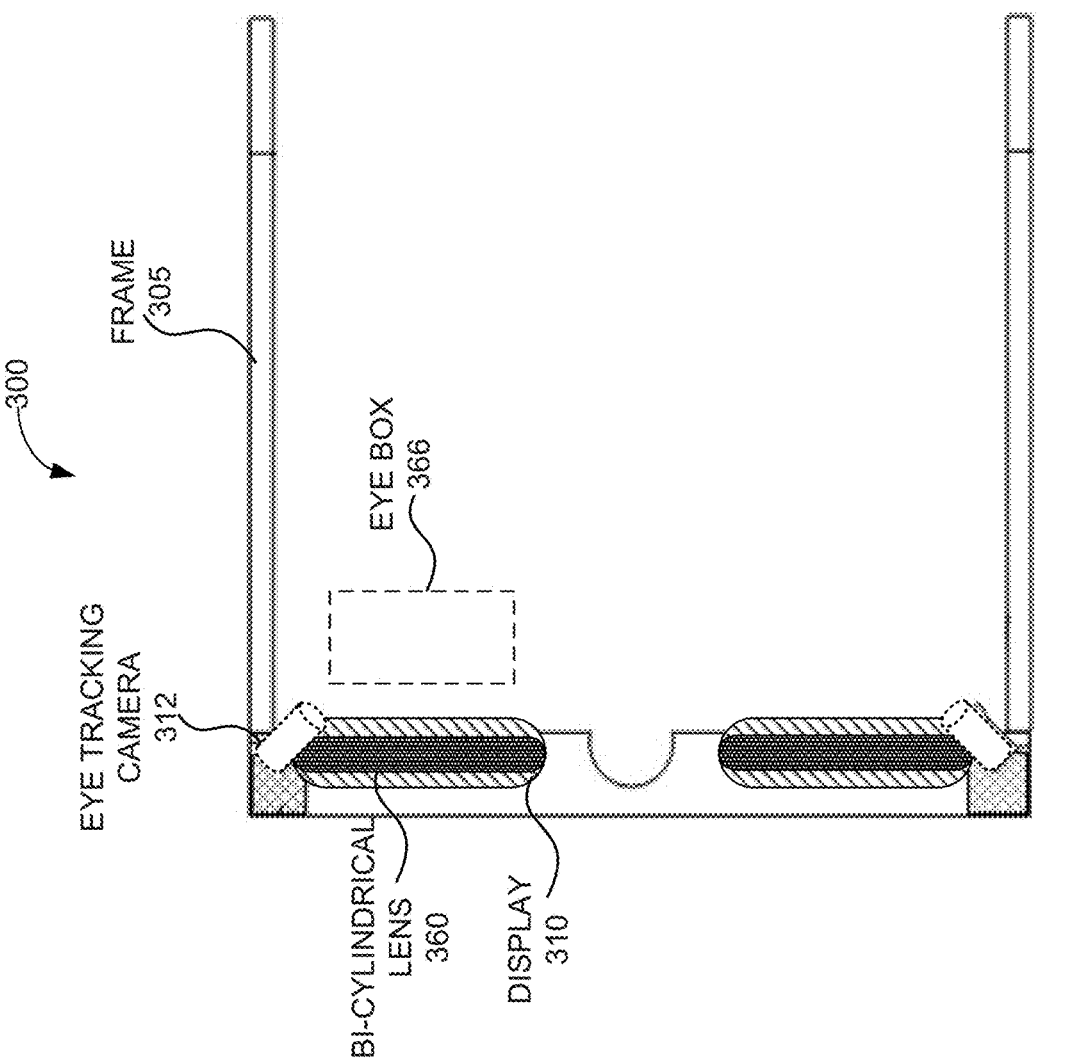

FIG. 3B is a top view of a near-eye display 300 in the form of a pair of glasses (or other similar eyewear), according to an example. In some examples, the near-eye display 300 may include a form factor of a pair of eyeglasses. The eyeglasses may support, for each eye: a display 310 to present content to an eye box 366, an eye tracking camera 312, and a bi-cylindrical lens 360. The bi-cylindrical lens 360 may be a liquid lens with flexible transparent active layers on both sides of a fluid, which may be transformed along two distinct deformation axes. The flexible transparent active layers may be polymer or ceramic piezoelectric materials that actuate the lens in response to applied voltage(s). The voltage(s), and thereby an optical focus of the lens, may be controlled by a processor on board the near-eye display 300 or a remote processor.

The eye tracking camera 312 may be used to determine position and/or orientation of both eyes of the user. Once the position and orientation of the user's eyes are known, a gaze convergence distance and direction may be determined. The imagery displayed by the display 310 may be adjusted dynamically to account for the user's gaze, for a better fidelity of immersion of the user into the displayed augmented reality scenery, and/or to provide specific functions of interaction with the augmented reality.

In some examples, the image processing and eye position/orientation determination functions may be performed by a central controller, not shown, of the near-eye display 300. The central controller may also provide control signals to the display 310 to generate the images to be displayed to the user, depending on the determined eye positions, eye orientations, gaze directions, eyes vergence, etc.

Figure 4:
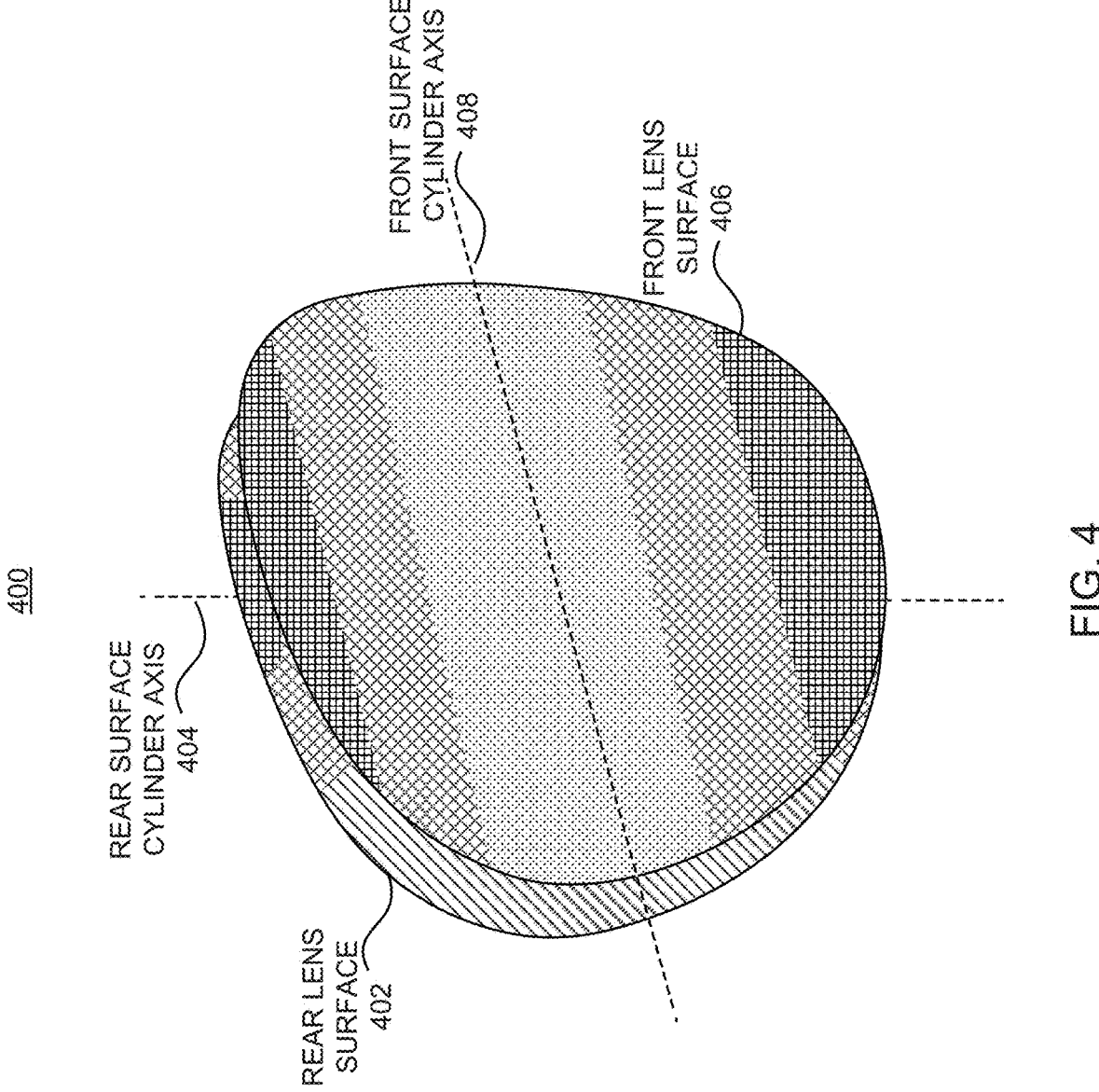
FIG. 4 illustrates a bi-cylindrical piezoelectric actuated lens with orthogonal deformation axes, according to an example.

FIG. 4 illustrates a bi-cylindrical piezoelectric actuated lens 400 with orthogonal deformation axes, according to an example. The bi-cylindrical piezoelectric actuated lens 400 may be a liquid lens with flexible transparent active layers (front lens surface 406 and rear lens surface 402) on both sides of a fluid, where the front lens surface 406 and rear lens surface 402 may be transformed along two distinct deformation axes (front surface cylinder axis 408 and rear surface cylinder axis 404). The flexible transparent active layers may be piezoelectric materials that actuate the lens in response to applied voltage(s). The piezoelectric properties and actuation mechanism of the transparent layers may be arranged to deform the lens cylindrically along the front surface cylinder axis 408 and rear surface cylinder axis 404 resulting in a net spherical deformation or a combination of spherical and cylindrical deformation with substantially less distortion than spherically deforming layers. While the bi-cylindrical piezoelectric actuated lens 400 is shown with orthogonal deformation axes, the axes do not need to be orthogonal, and may have any angle between them.

Piezoelectric actuated liquid lenses commonly have one rigid surface, referred to as a substrate, and one flexible surface that is intended to deform spherically to achieve a target optical power. The deformation of a flat layer into a spherical shape may be limited by an instability that prevents excessive deformation and may limit an attainable optical power. The stability limit may occur earlier (and may therefore be more limiting) when the lens size is bigger and when the lens thickness is smaller. Thus, a possible diopter range of actuation may be limited to +1-1.5 diopters for many liquid lens configurations. This instability mode of deformation does not occur when a flat surface deforms cylindrically instead of spherically. When the two surfaces of a lens are cylindrical along different (ideally perpendicular) axes, the net optical response may be a spherical deformation. This type of lens is referred to as a bi-cylindrical lens. Rigid bi-cylindrical lenses tend to have good optical performance comparable to lenses where one surface is flat such as plano-convex, plano-concave, or even convex-convex, and concave-concave lenses. The cylindrical shapes may have additional a-cylindrical terms to improve optical performance, just like a-spherical terms for spherical lenses. A-cylinder terms are additional deformations of the lens surface beyond a cylinder shape. The cylindrical shape may have additional spherical deformation terms that are smaller in magnitude than the spherical deformations in a spherical lens, and hence not enough to trigger then spherical instability.

When evaluating optical performance, a combined optical power that light may experience as it passes through both lens surfaces may be used as measure of optical performance. Even though each surface in the bi-cylindrical piezoelectric actuated lens 400 may be cylindrical, the combined optical power may be mostly spherical. The fluid between the surfaces may have a refractive index in a range between 1.5 and 1.9. In some example implementations, a refractive index of about 1.65 may be used.

Figure 5A:
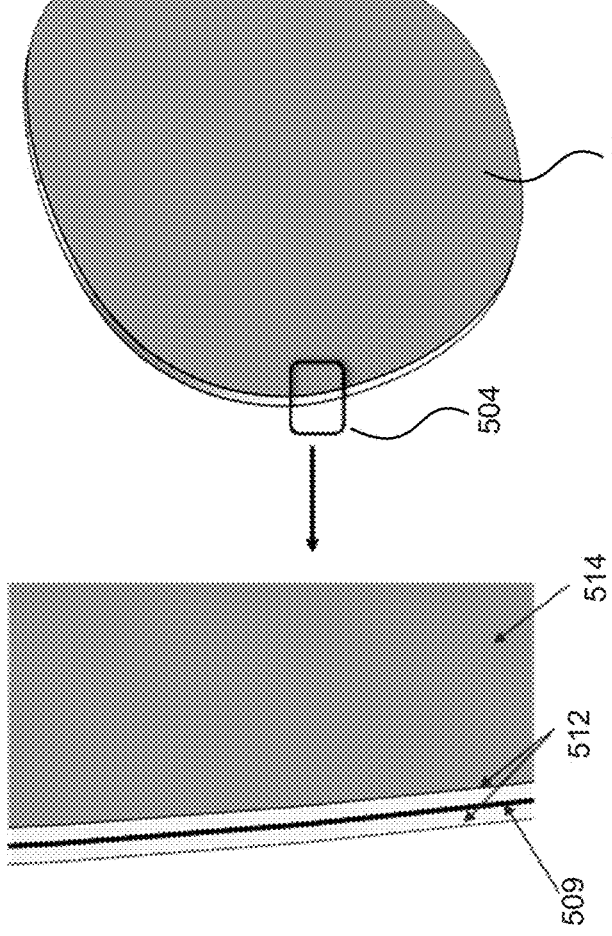
FIG. 5A illustrates a perspective view and a blow-up cross-section view of a bi-cylindrical piezoelectric actuated lens with dual polymeric piezoelectric layers, according to an example.
Figure 5A:
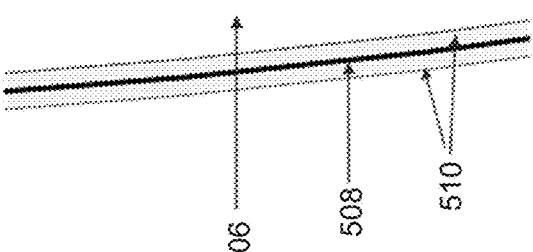

FIG. 5A illustrates a perspective view and a blow-up cross-section view 504 of a bi-cylindrical piezoelectric actuated lens 502 with dual polymeric piezoelectric layers, according to an example. Diagram 500A shows in the blow-up cross-section view 504 of the bi-cylindrical piezoelectric actuated lens 502, a lens fluid 506 between two active layers, where a first active layer may include piezoelectric layers 510 affixed by an adhesive layer 508 and a second active layer may include piezoelectric layers 512 affixed by another adhesive layer 509. Thus, the lens fluid 506 is surrounded by dual piezoelectric layers.

In some examples, one or both external surfaces of the active layers may be covered with additional transparent and flexible layers (e.g., layer 514) for electrodes, filtering, polarization, or comparable optical functions. Furthermore, each active layer may comprise more than 2 (e.g., 3, 4, 5, etc.) piezoelectric layers. The piezoelectric layers may be made from a variety of materials. For example, polyvinylidene fluoride (PVDF) a semicrystalline, thermoplastic polymer may be used. In an example implementation, both active layers may be made from two piezoelectric anisotropic polyvinylidene fluoride (PVDF) layers making the lens a bimorph. The adhesive layers 508 and 509 may include same or different adhesive materials and have same or different thicknesses. The adhesive materials may be any transparent, adhesive material such as acrylates. In some examples, the thickness of the PVDF layers may be 40 um, or more (60 um, 80 um, 100 um, or more), or less (20 um, 10 um, or 5 um) depending on the lens application. The thickness of the PMN_PT layers may be 10 um, or more (20 um, 40 um, or more), or less (8 um, 5 um) also depending on the lens application.

Figure 5B:
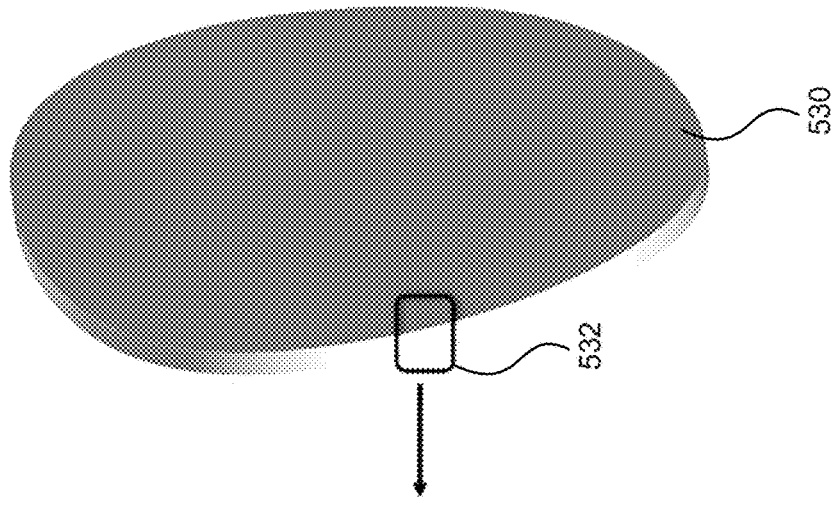
FIG. 5B illustrates a perspective view and a blow-up, cross-section view of a bi-cylindrical piezoelectric actuated lens with dual ceramic piezoelectric layers, according to an example.
Figure 5B:
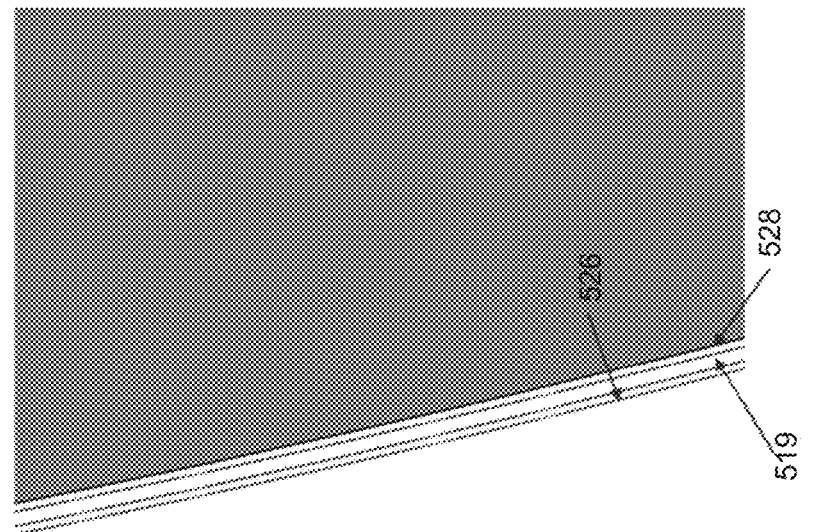
Figure 5B:
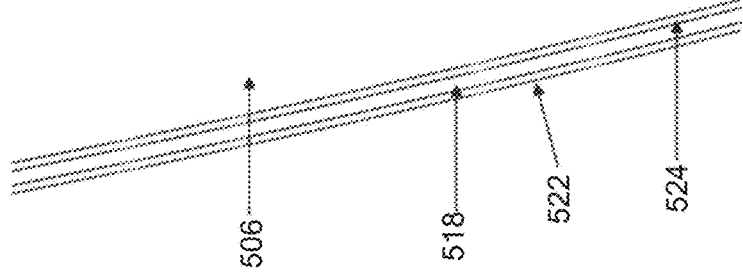

FIG. 5B illustrates a perspective view and a blow-up cross-section view 532 of a bi-cylindrical piezoelectric actuated lens 530 with dual ceramic piezoelectric layers, according to an example. Diagram 500B shows in the blow-up cross-section view 532 of the bi-cylindrical piezoelectric actuated lens 530, a lens fluid 506 between two active layers, where a first active layer may include piezoelectric layers 522 and 524 affixed by an adhesive layer 518 and a second active layer may include piezoelectric layers 526 and 528 affixed by another adhesive layer 519.

Differently from the configuration shown in diagram 500A, the configuration in diagram 500B may include ceramic piezoelectric layers. For example, the piezoelectric layers 522, 524, 526, and 528 may be made from lead magnesium niobate-lead titanate (PMN-PT) with high electromechanical coupling coefficient, high piezoelectric coefficient, and low dielectric loss. Thicknesses of the active layers and adhesives may be adjusted to be suitable for the stiffer ceramic lead magnesium niobate-lead titanate (PMN-PT) properties.

A piezoelectric coupling matrix or piezoelectric charge coefficient matrix, dij [Coulombs/Newton], is a characteristic of piezoelectric materials quantifying electrical to mechanical force conversion. The first subscript (i) provides the direction of the charge associated with an applied electric field. The second subscript (j) provides the component of the mechanical strain tensor. Integer values 1, 2, 3 may be used to represent three axes of a three-dimensional (Cartesian) system for the first (i) subscript. Integer values 1-6 may be used to represent the six components of the strain tensor, in this order (three normal strain components in 1, 2, and 3 directions, followed by three shear strain components in 1-2, 2-3, 3-1 direction). For example, 1 and 2 may represent two orthogonal directions perpendicular to a direction in which the piezoelectric material is polarized, while 3 may represent the direction in which the piezoelectric material is polarized. In the liquid lens configurations discussed herein, piezoelectric coupling factors d31 and d32 may be the relevant piezoelectric properties.

While polyvinylidene fluoride (PVDF) piezoelectric layers may achieve a high d31 and zero or close to zero d32 (desired parameters for this application), ceramic piezoelectric layers may not be able to achieve a zero d32. In some examples, d32 for one layer of the top and bottom bimorphs may be selected to have a d32 of equal magnitude but opposite sign compared to the d32 of the other layer of the bimorph resulting in very similar uniform bi-cylindrical deformation with the same spherical optical level, and the same level of optical distortion as the d32 equal zero case. If d32 values for the two layers of a bimorph are not equal and opposite, the layer stiffness, thickness, or voltages may be adjusted to obtain the uniform bi-cylindrical deformation.

Figure 5C:
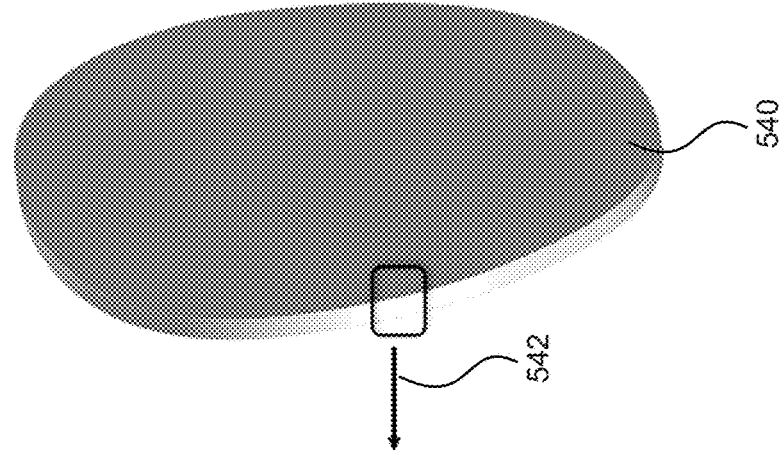
FIG. 5C illustrates a perspective view and a blow-up, cross-section view of a bi-cylindrical piezoelectric actuated lens with single polymeric piezoelectric layers on either side of the fluid, according to an example.
Figure 5C:
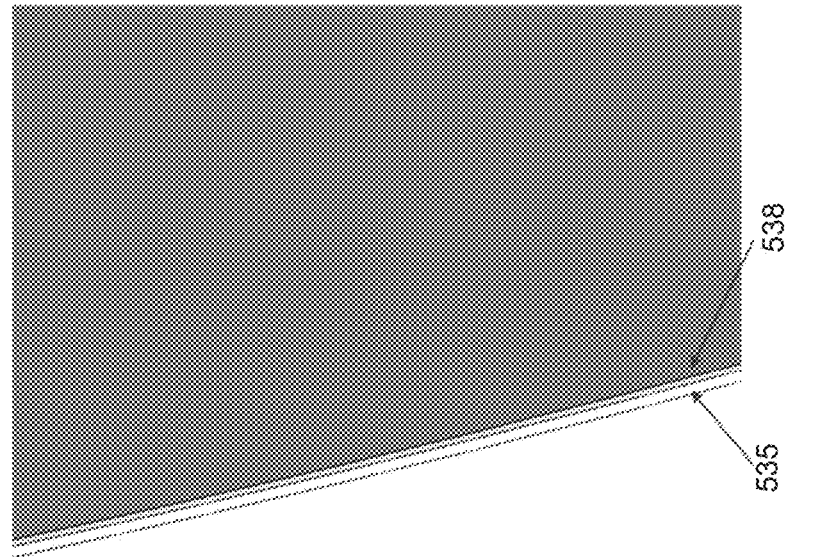
Figure 5C:
Figure 5C:
Figure 5C:
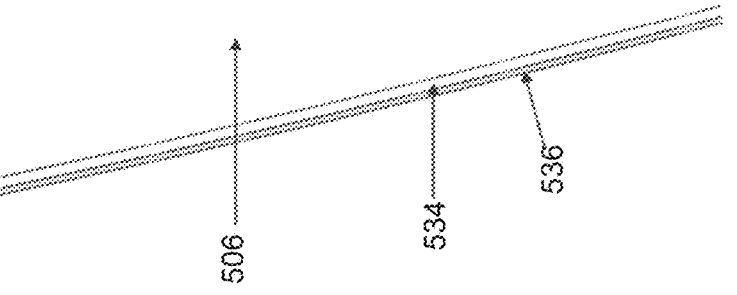

FIG. 5C illustrates a perspective view and a blow-up cross-section view 542 of a bi-cylindrical piezoelectric actuated lens 540 with single polymeric piezoelectric layers on either side of the fluid, according to an example. Diagram 500s shows in the blow-up cross-section view 542 of the bi-cylindrical piezoelectric actuated lens 540, a lens fluid 506 between two active layers, where a first active layer may include single piezoelectric layer 536 affixed by a passive layer 534 to a flexible container holding the fluid 506 and a second active layer may include single piezoelectric layer 538 affixed to the container by another passive layer 535. The passive layers may be an adhesive material, or an adhesive material attached to a substrate material.

The configuration in diagram 500C includes two active lens layers instead of four (in diagrams 500A and 500B), where each layer acts as a unimorph. This configuration may also reach a uniform bi-cylindrical deformation with similar spherical optical level and optical distortion. A required voltage for a unimorph may be higher though, for example, and may be double the voltage needed for bimorph configurations. Fewer optical layers may provide additional benefits, however, such as reduced haze, etc. In some examples, the front and rear active layers may be different, that is, one may be a unimorph while the other may be a bimorph. In some examples, even though the active layers are bimorphs, only one side can be actuated at a time, effectively acting as a unimorph. The front and rear active layers may also have different thickness, stiffness, adhesives, and/or piezoelectric properties. Applied voltages may be selected depending on characteristics and types of the active layers.

Figure 6:
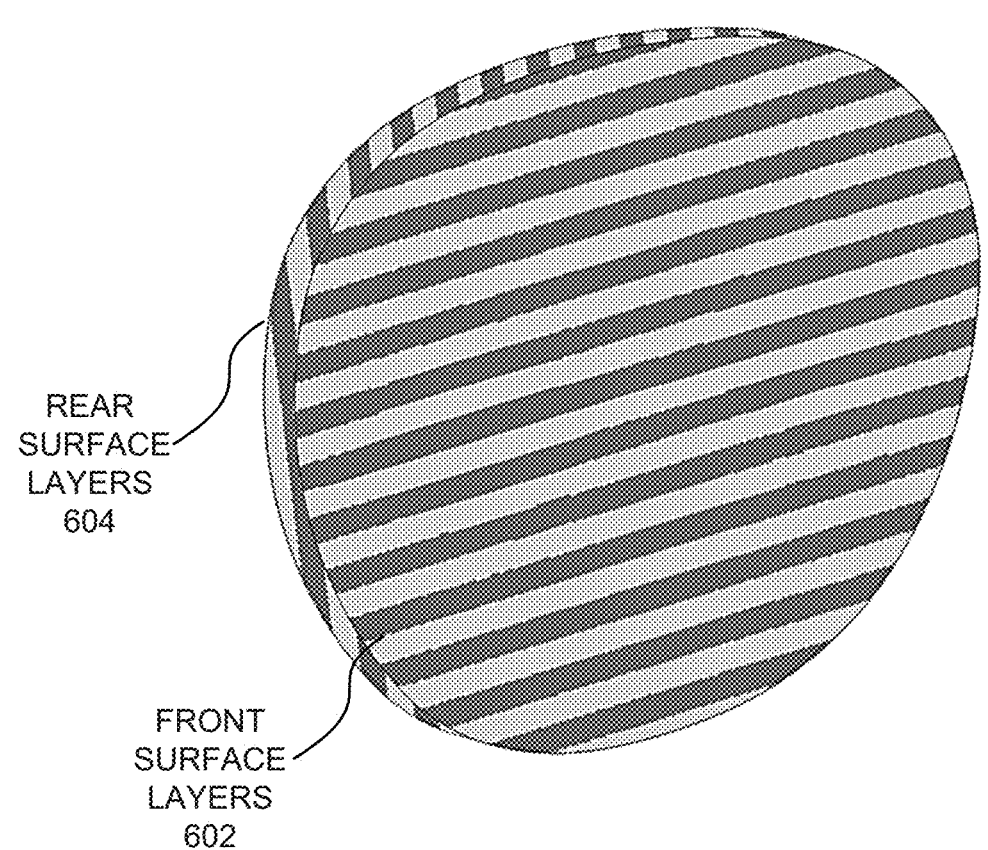
FIG. 6 illustrates a perspective view of a bi-cylindrical piezoelectric actuated lens, where two front layers have a primary orientation in the horizontal direction and two rear layers have a primary orientation in the vertical direction, according to an example.

FIG. 6 illustrates a perspective view of a bi-cylindrical piezoelectric actuated lens 600, where two front layers have a primary orientation in the horizontal direction and two back layers have a primary orientation in the vertical direction, according to an example. As discussed herein, some bi-cylindrical piezoelectric actuated lens configurations may include dual (or more) piezoelectric layers in their front surface layers 602 and rear surface layers 604. A primary orientation (deformation axis) of each surface may be at an angle to another, for example, the primary orientations may be orthogonal.

In the liquid lens configuration of FIG. 6, the two front surface layers 602 (indicate by alternating shades) may have a primary orientation in the horizontal direction (i.e., 0 degrees) and the two rear surface layers 604 may have a primary orientation in the vertical direction (i.e., 90 degrees). The surface layers (piezoelectric layers) may be isotropic or anisotropic in mechanical stiffness. The anisotropic stiffness may be high in one direction (of stretching) and may be 2×, 4×, 10×, or up to 20× higher than the isotropic stiffness (e.g., that of polyvinylidene fluoride (PVDF) material). Polyvinylidene fluoride (PVDF) that is stiffer in one direction is referred as "uniax". A good optical performance may still be achieved if the modulus of the polyvinylidene fluoride (PVDF) is lower or higher, and if the d31 piezoelectric constant is lower or higher. The required voltage and layer thickness may be affected, but not the optical performance.

In some example implementations, each layer may have a thickness of about 40 micrometers (PVDF material) with piezoelectric properties of d31=30 pC/N and d32≈0 pC/N, elastic modulus=10 GPa in primary direction and 2.5 GPa in two other directions. In some examples, four electrodes may be used (one for each side of the piezoelectric layers). Alternatively, three electrodes may also be used (one on the outside surface of the piezoelectric layer and two between the layers).

Figure 7:
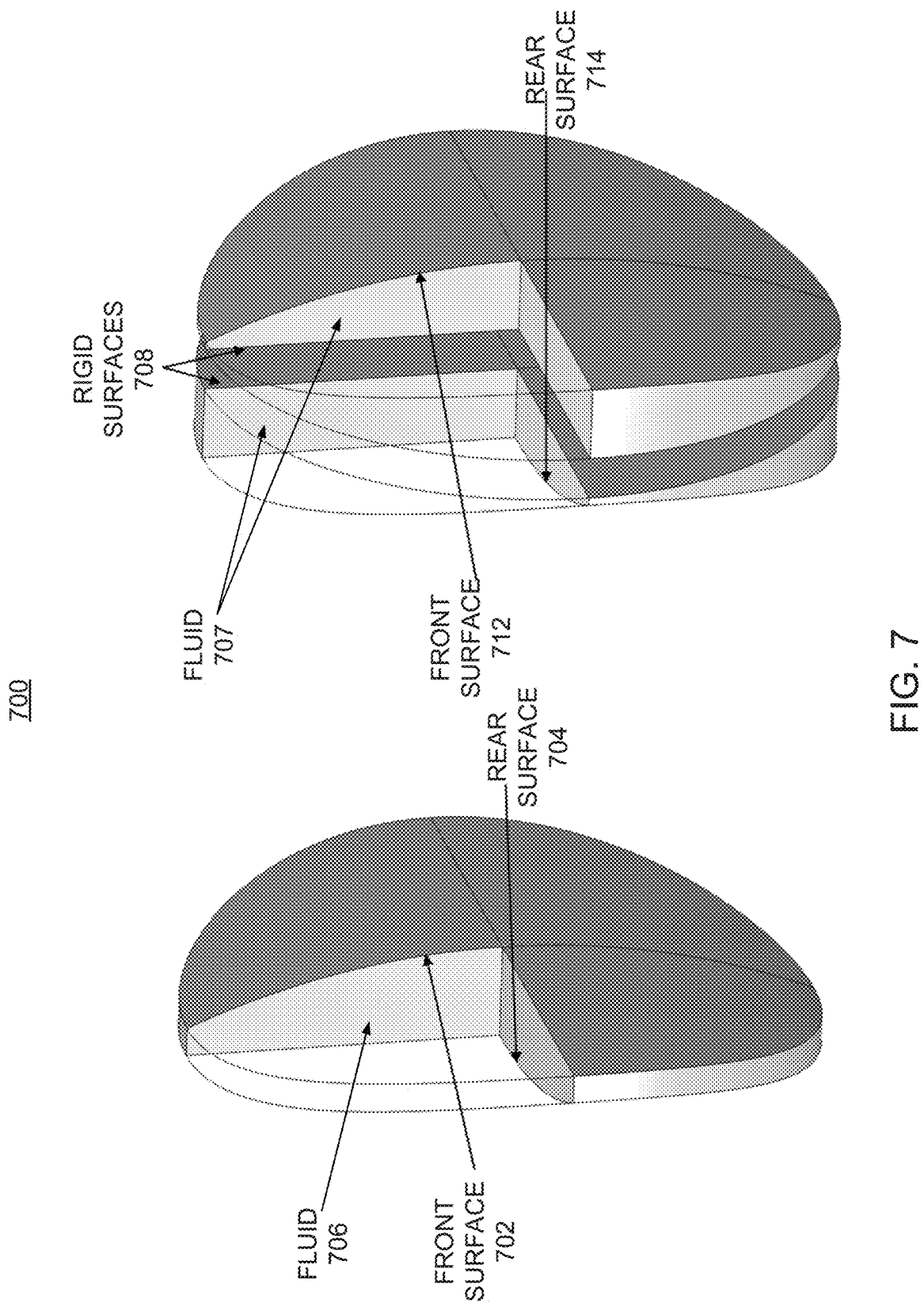
FIG. 7 illustrates a perspective view of a bi-cylindrical piezoelectric actuated lens with and without internal transparent surfaces between the piezoelectric front and rear layers, according to an example.

FIG. 7 illustrates a perspective view of a bi-cylindrical piezoelectric actuated lens with and without transparent surfaces between the piezoelectric front and rear layers, according to an example. Diagram 700 shows a first bi-cylindrical piezoelectric actuated lens configuration with fluid 706 surrounded by front surface 702 and rear surface 704. This configuration has no transparent surface between the front and back rear lens surfaces. Diagram 700 also shows a second bi-cylindrical piezoelectric actuated lens configuration, where the fluid 707 between a front surface 712 and a rear surface 714 is split into two segments by a pair of internal surfaces 708. Thus, the lens may also be made of two parts each having one cylindrical piezoelectric surface and a flat (and possibly stiff) substrate. The lens may also have an additional stiff substrate (the internal surfaces 708) between the two lens surfaces to help support the lens. In another example, the two components of the lens may be made into one with one flat surface (instead of the two internal surfaces 708) between the two cylindrical sides. The fluid 707 in the split configurations may be completely separate between the two components or connected through the internal surface(s). The internal surfaces 708 may also be flexible since they may not experience much deformation.

In some examples, each active layer may be connected to electrodes that can provide a specific electric field across that layer. Voltages across each piezoelectric layer may be equal or different, to achieve a designated optical response or to provide better resistance to gravity sag. The fluid in the lens may be enclosed between the piezoelectric layers, the substrate, and a support structure (also referred to as "bag") around the circumference. In some examples, an initial state of the lens may be flat or curved, in order to increase the total optical response range, reduce distortion, reduce space claim, or reduce required voltage.

The space between the front and rear lens surfaces is fluid filled. It may be beneficial in some applications to reduce that fluid thickness (or gap between the front and rear lens surfaces). There may be a minimum requirement for this gap, such that the front and rear lens surfaces do not touch due to actuation. Thus, the bigger the actuation range for the lens, the bigger the minimum fluid thickness may have to be. As a target diopter range for the lens increases, more fluid may be needed and the initial distance between the lens surfaces may need to be increased. The initial distance between the lens surfaces (fluid layer thickness) may also be governed by the supporting bag design, the fluid transient response during actuation, and other factors.

Figure 8A:
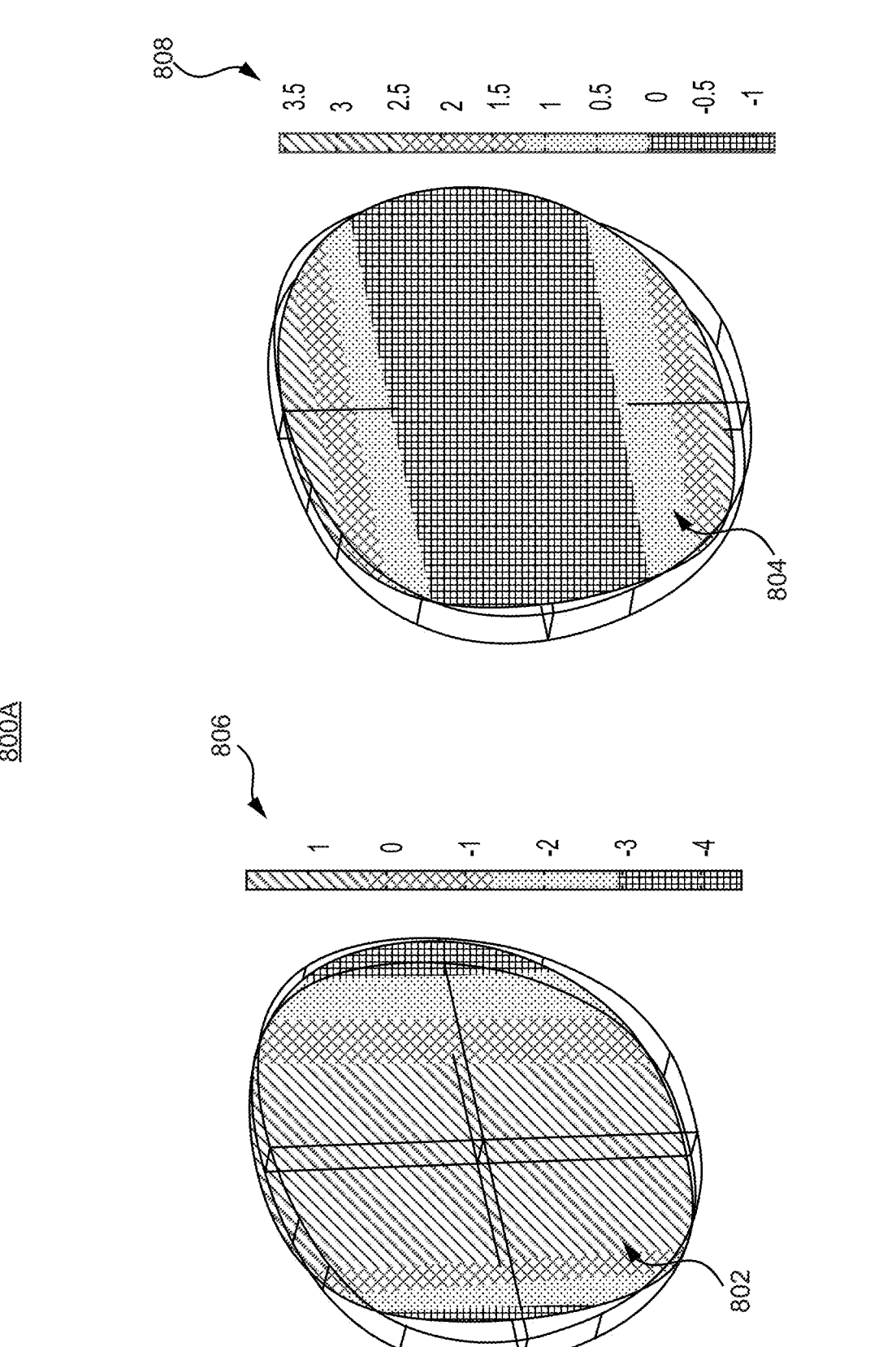
FIG. 8A illustrates deformations experienced by the front and rear layers of a bi-cylindrical piezoelectric actuated lens, according to an example.

FIG. 8A illustrates deformations experienced by the front and rear layers of a bi-cylindrical piezoelectric actuated lens, according to an example. Diagram 800A shows a rear surface 802 of the bi-cylindrical piezoelectric actuated lens with the color scale indicating out-of-plane displacement in mm as quantified on the scale 806. Diagram 800A also shows a front surface 804 of the bi-cylindrical piezoelectric actuated lens with the color scale indicating out-of-plane displacement in mm as quantified on the scale 808.

In some examples, each layer may deform as a cylinder or close to a cylinder. The two cylinders in the illustrated example have axes that are 90 degrees apart (orthogonal) with the rear surface 802 deforming cylindrically about vertical axis, while the front surface 804 deforms cylindrically about horizontal axis.

Figure 8B:
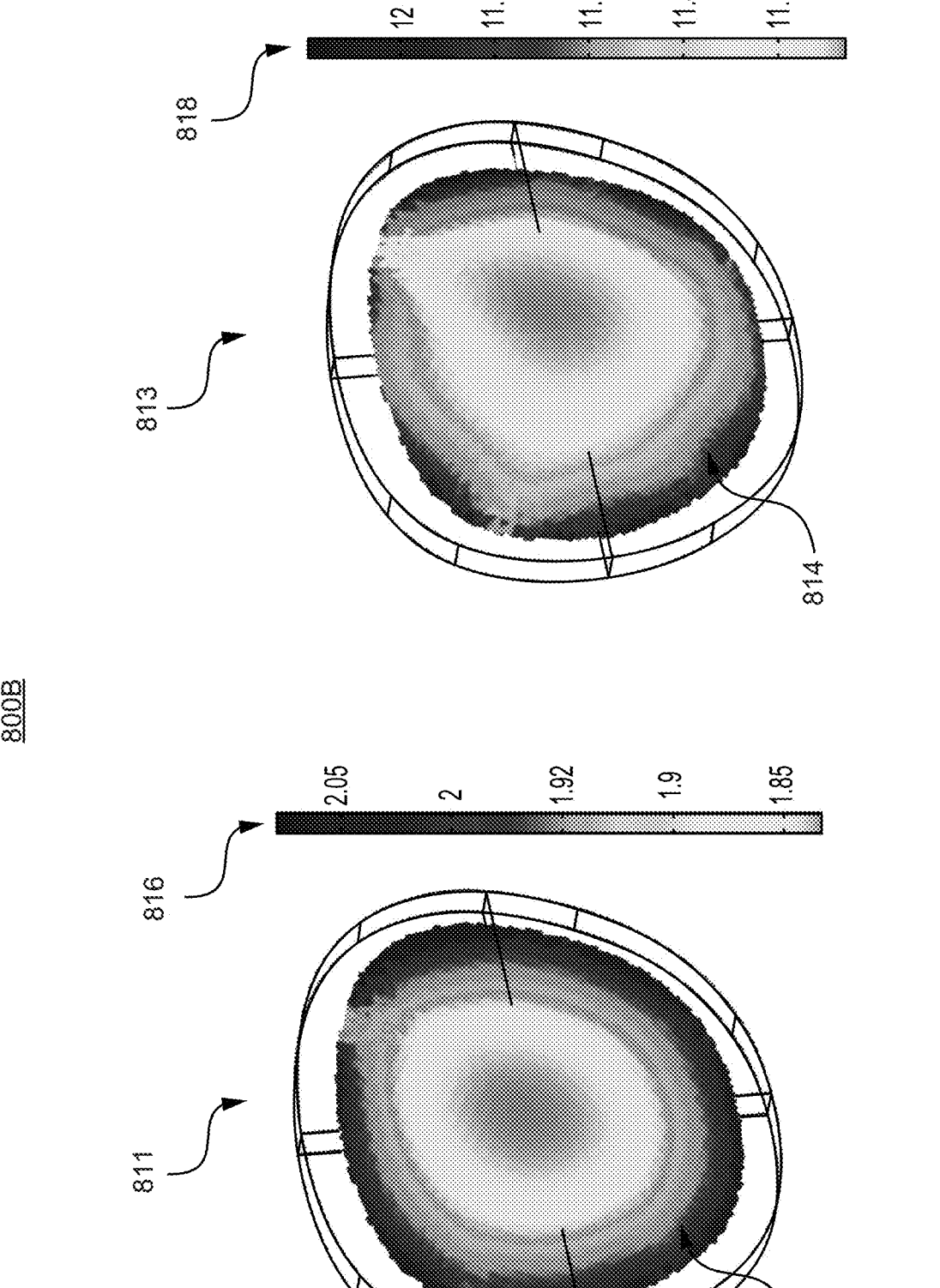
FIG. 8B illustrates combined optical power estimates for both front and rear lens surfaces at two deformation levels for a bi-cylindrical piezoelectric actuated lens, according to an example.

FIG. 8B illustrates combined optical power estimates for both front and rear lens surfaces at two deformation levels for a bi-cylindrical piezoelectric actuated lens, according to an example. Diagram 800B shows a combined optical power estimate 812 for both front and back lens surfaces of a bi-cylindrical piezoelectric actuated lens in configuration 811 for a first deformation level with the color scale indicating combined diopters as quantified on the scale 816. Diagram 800B also shows a combined optical power estimate 814 for both front and back lens surfaces of the bi-cylindrical piezoelectric actuated lens for configuration 813 at a second (higher) deformation level with the color scale indicating combined diopters as quantified on the scale 818.

The configuration 811 for the first deformation level shows an average of about 2.0 diopters and the configuration 813 for the second deformation level shows an average of about 11.5 diopters. In both cases the optical power variation is relatively close to uniform. In some examples, the optical power variation may be made even more uniform via optimization of the voltage variation, bag stiffness, and/or piezoelectric properties of the active layers.

Figure 9A:
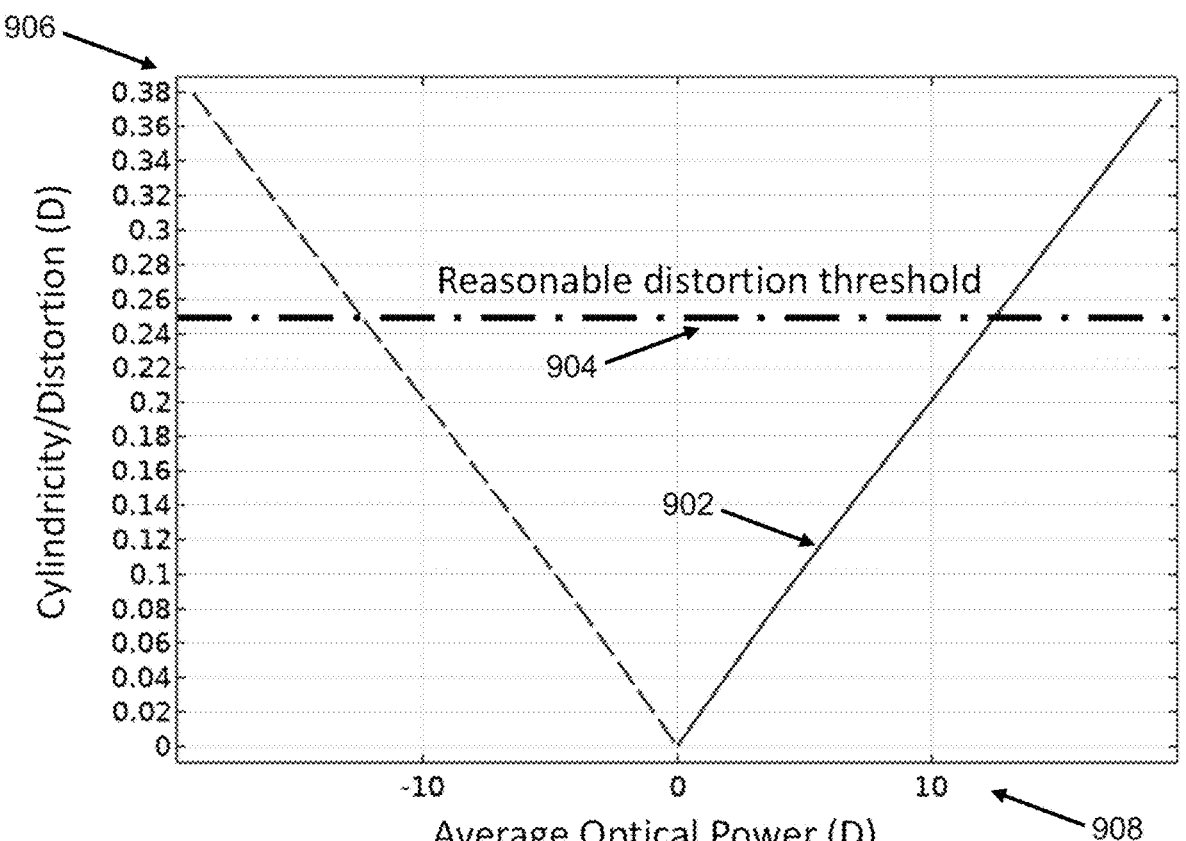
FIG. 9A illustrates cylindricity (distortion) versus optical power of a bi-cylindrical piezoelectric actuated lens as it is actuated in both directions on the horizontal axis, according to an example.

FIG. 9A illustrates cylindricity (one measure of distortion) versus optical power of a bi-cylindrical piezoelectric actuated lens as it is actuated in both directions on the horizontal axis, according to an example. Diagram 900A shows an optical power vs. distortion plot 902 across average optical power axis 908 and cylindricity/distortion axis 906.

The plot 902 depicts optical power of the bi-cylindrical piezoelectric actuated lens as it is actuated in both directions on the horizontal axis, and the cylindricity which is a measure of optical distortion on the vertical axis. Because the cylindrical deformation of each surface of the bi-cylindrical piezoelectric actuated lens is a stable deformation, the lens may reach very high combined optical powers for low distortion levels. For example, for a reasonable distortion threshold 904 of 0.25 diopters, a viable range of optical powers of the bi-cylindrical piezoelectric actuated lens may be 24 diopters (+/−12 diopters).

Figure 9B:
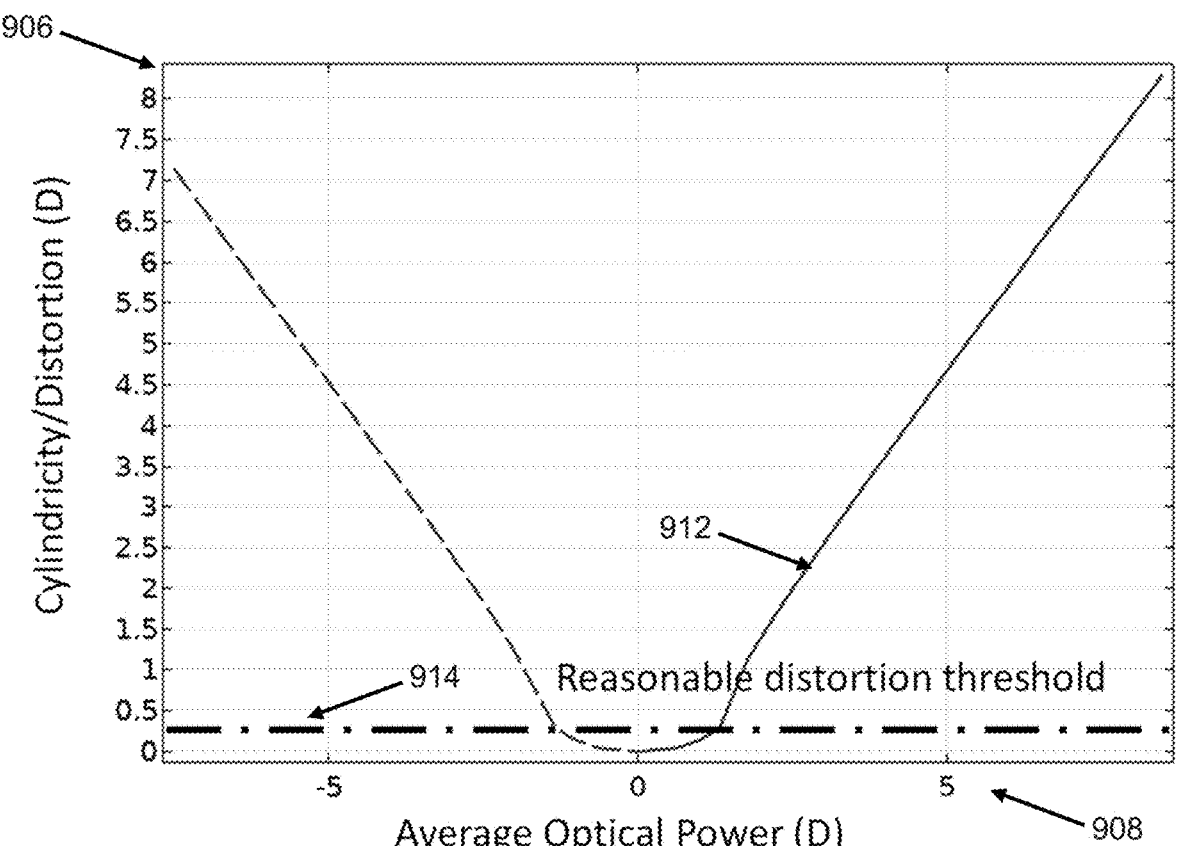
FIG. 9B illustrates cylindricity (distortion) versus optical power of a comparable spherical lens as it is actuated on the horizontal axis, according to an example.

FIG. 9B illustrates cylindricity (distortion) versus optical power of a comparable spherical lens as it is actuated on the horizontal axis, according to an example. Diagram 900B shows an optical power vs. distortion plot 912 for a spherical transformable lens across average optical power axis 908 and cylindricity/distortion axis 906.

The spherical transformable lens in this example is comparable to the bi-cylindrical piezoelectric actuated lens in terms of materials, dimensions, etc. However, as the diagram 900B shows, for the same reasonable distortion threshold 914 of 0.25 diopters, a viable range of optical powers of the spherical transformable lens may be about 2 diopters (+1-1 diopters). Beyond the distortion threshold, the lens surface fails to deform spherically.

Figure 9C:
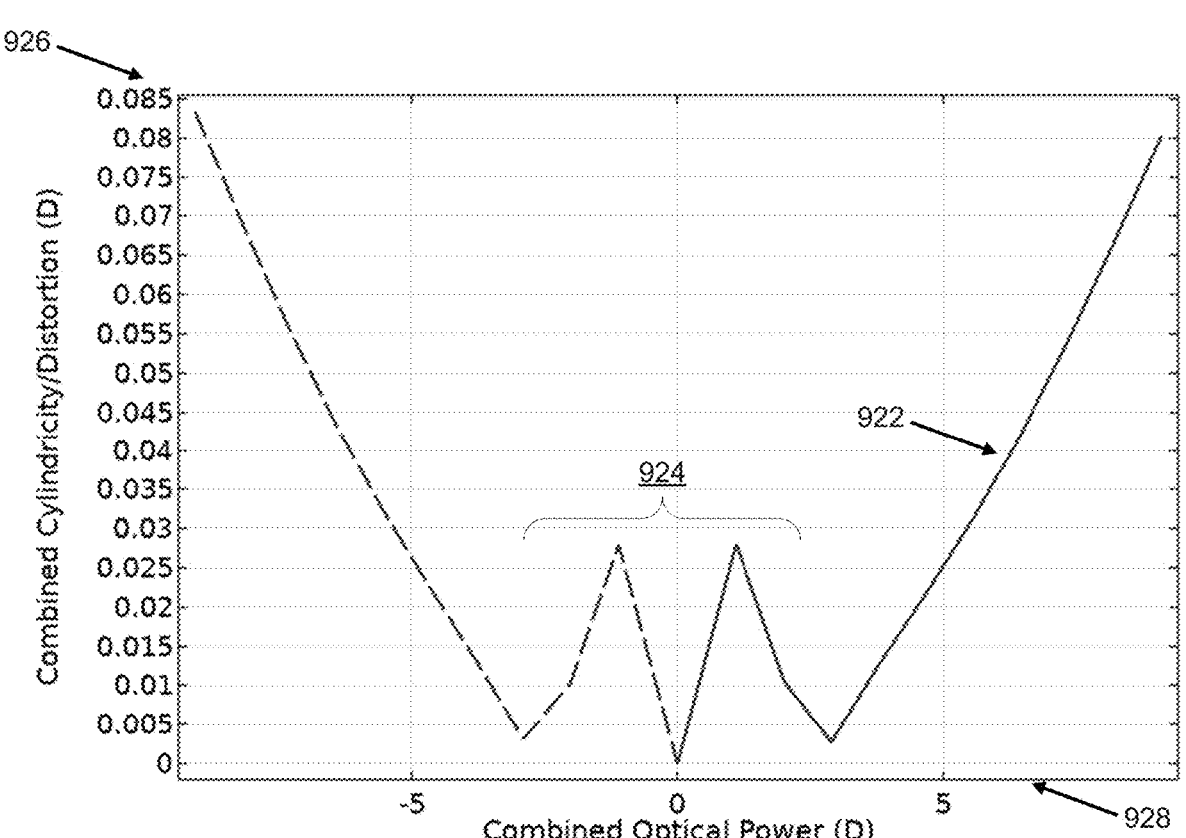
FIG. 9C illustrates combined cylindricity (distortion) versus combined optical power of a bi-cylindrical piezoelectric actuated lens showing how net cylindricity of the lens may be reduced further by varying the voltages applied to the front and rear layers of the lens, according to an example.

FIG. 9C illustrates combined cylindricity (distortion) versus combined optical power of a bi-cylindrical piezoelectric actuated lens showing how net cylindricity of the lens may be reduced further by varying the voltages applied to the front and rear layers of the lens, according to an example. Diagram 900C shows an optical power vs. distortion plot 922 across combined optical power axis 928 and combined cylindricity/distortion axis 926.

In some examples, the combined cylindricity of bi-cylindrical piezoelectric actuated lens may be reduced even further by varying the voltages applied to the front and rear active layers of the lens (924). With this approach, near zero cylindricity may also be obtained. Further performance comparisons of a bi-cylindrical piezoelectric actuated lens and a comparable spherical transformable lens as discussed in conjunction with FIGS. 10A-10D below.

In some examples, the target of the bi-cylinder piezoelectric actuated lens may be a non-zero net cylinder deformation along one of the axes of the bi-cylinder lens. That is instead of the zero net cylinder target described above. This may be achieved by varying the voltages applied to the two bi-cylinders, or their thickness or their mechanical or piezoelectric properties, or the support structure. The application of this non-zero net cylinder deformation may be to counter or correct for the user's astigmatism.

Figure 10A:
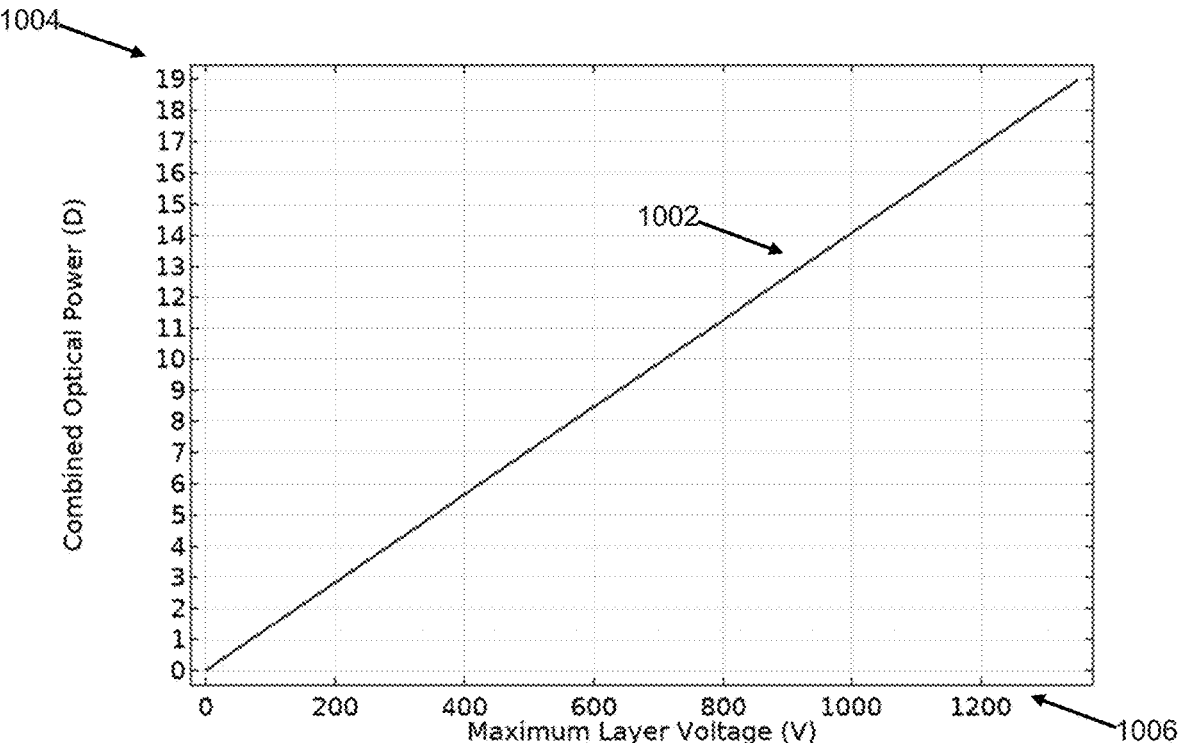
FIGS. 10A and 10B illustrate voltages required across each layer of a bi-cylindrical piezoelectric actuated lens and a comparable spherical lens to achieve particular levels of combined optical power, according to examples.
Figure 10B:
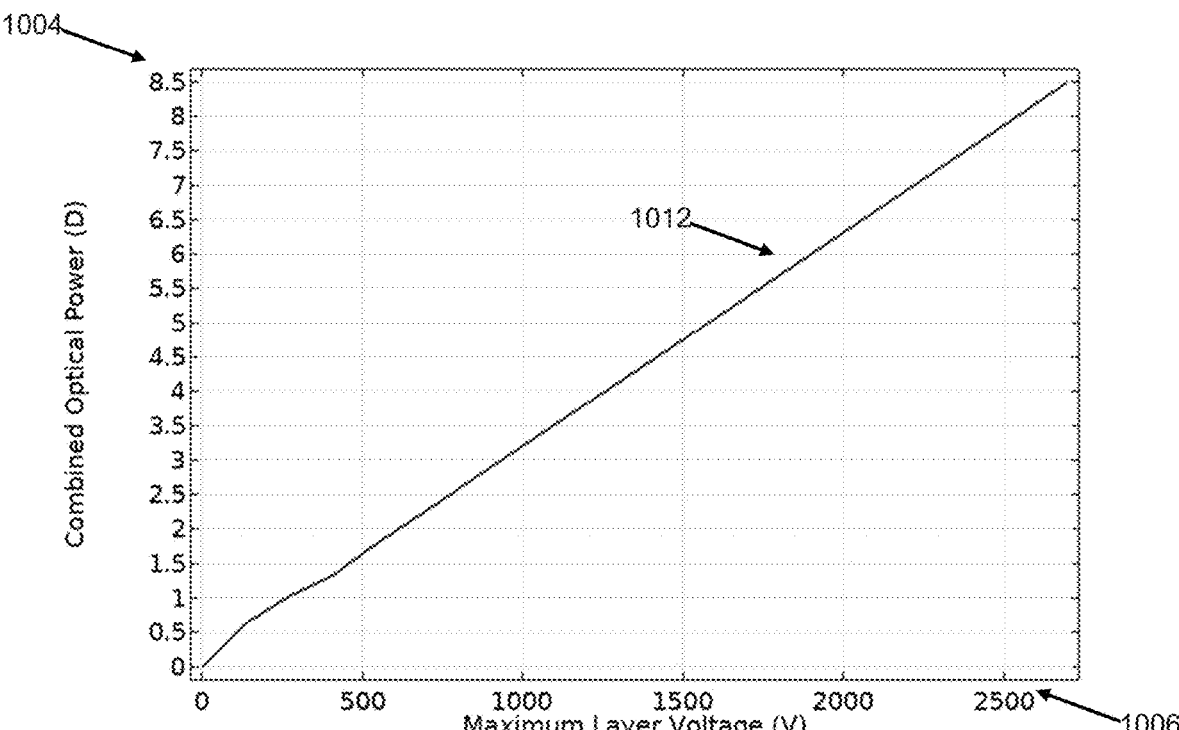

FIGS. 10A and 10B illustrate voltages required across each layer of a bi-cylindrical piezoelectric actuated lens and a comparable spherical lens to achieve particular levels of combined optical power, according to examples. Diagram 1000A shows an applied voltage vs. attained optical power plot 1002 for a bi-cylindrical piezoelectric actuated lens across maximum layer voltage axis 1006 and combined optical power axis 1004. Diagram 10006 shows an applied voltage vs. attained optical power plot 1012 for a comparable spherical transformable lens across maximum layer voltage axis 1006 and combined optical power axis 1004.

As the plots 1002 and 1012 indicate, required voltages for the comparable spherical lens may be about double the required voltages for the bi-cylindrical piezoelectric actuated lens to obtain similar optical power levels. The spherical transformable lens may be comparable to the bi-cylindrical piezoelectric actuated lens in terms of materials, dimensions, etc.

Figure 10C:
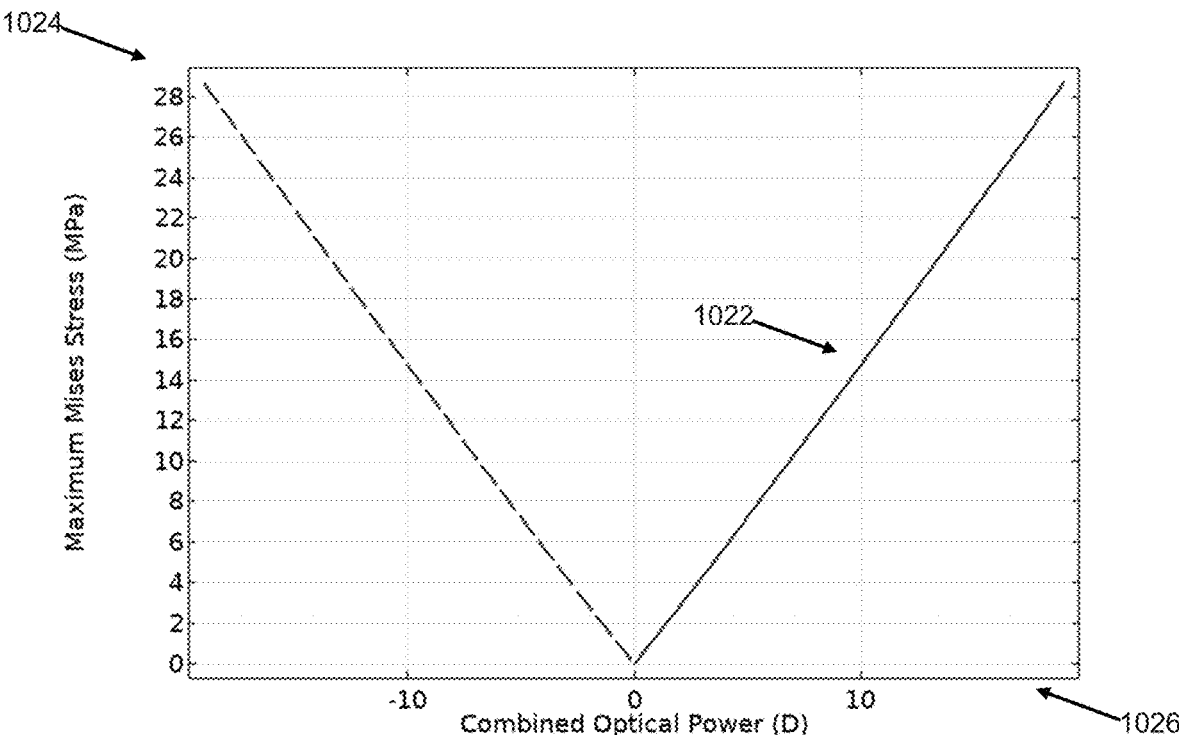
FIGS. 10C and 10D illustrate maximum stresses in a bi-cylindrical piezoelectric actuated lens and a comparable spherical lens as a function of combined optical power, according to examples.
Figure 10D:
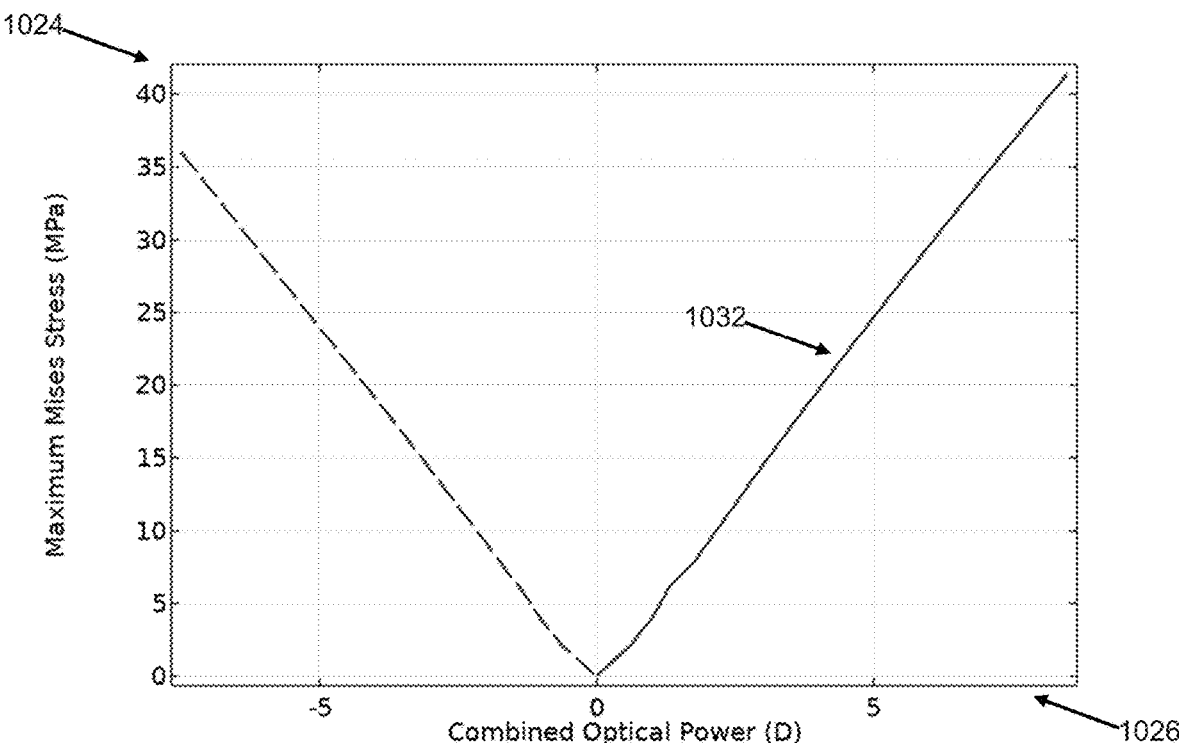

FIGS. 10C and 10D illustrate maximum stresses in a bi-cylindrical piezoelectric actuated lens and a comparable spherical lens as a function of combined optical power, according to examples. Diagram 1000C shows a combined optical power vs. maximum stress plot 1022 for a bi-cylindrical piezoelectric actuated lens across combined optical power axis 1026 and maximum von Mises stress axis 1024. Diagram 1000D shows a combined optical power vs. stress plot 1032 for a comparable spherical transformable lens across combined optical power axis 1026 and maximum Mises stress axis 1024.

The von Mises stress (also referred to as Mises stress) is a measure to predict yielding of materials under complex loading. The von Mises stress satisfies a property where two stress states with equal distortion energy have an equal von Mises stress. As the plots 1022 and 1032 indicate, the maximum stresses generated in the bi-cylindrical piezoelectric actuated lens may be about four times less than those generated in a comparable spherical transformable lens. Thus, possibility of mechanical failure, creep, and/or permanent deformation may be reduced, while optical properties may be enhanced such as lower stress-induced birefringence.

Figure 11A:
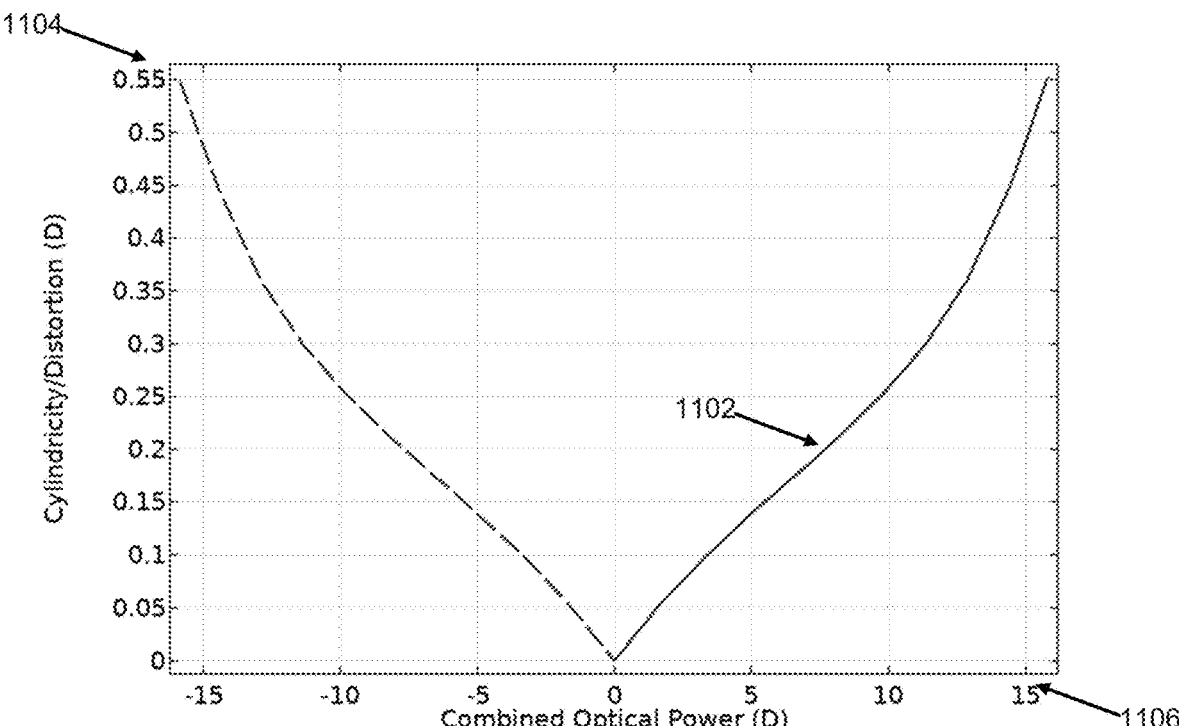
FIG. 11A illustrates combined cylindricity (distortion) versus combined optical power of a bi-cylindrical piezoelectric actuated lens with ceramic piezoelectric layers, according to an example.

FIG. 11A illustrates combined cylindricity (distortion) versus combined optical power of a bi-cylindrical piezoelectric actuated lens with ceramic piezoelectric layers, according to an example. Diagram 1100A shows a combined optical power vs. cylindricity/distortion plot 1102 for a bi-cylindrical piezoelectric actuated lens with ceramic piezoelectric layers across combined optical power axis 1106 and cylindricity/distortion axis 1104. The plot 1102 in diagram 1100A may be compared to the plot 902 in FIG. 9A for a bi-cylindrical piezoelectric actuated lens with polymer (e.g., polyvinylidene fluoride (PVDF)) piezoelectric layers. The polymer piezoelectric layers may have the advantage of achieving near zero or zero d32 values.

As discussed herein, near zero or zero d32 values may be approximated for ceramic piezoelectric layers by using identical positive and negative d32 values on respective layers of a bimorph. As the plot 1102 indicates, the ceramic active layer lens may have similar diopter range (e.g., 10) for a reasonable distortion threshold of 0.25. If d32 values for the two layers of a bimorph are not equal and opposite, the layer stiffness, thickness, or voltages may be adjusted to obtain the uniform bi-cylindrical deformation.

Figure 11B:
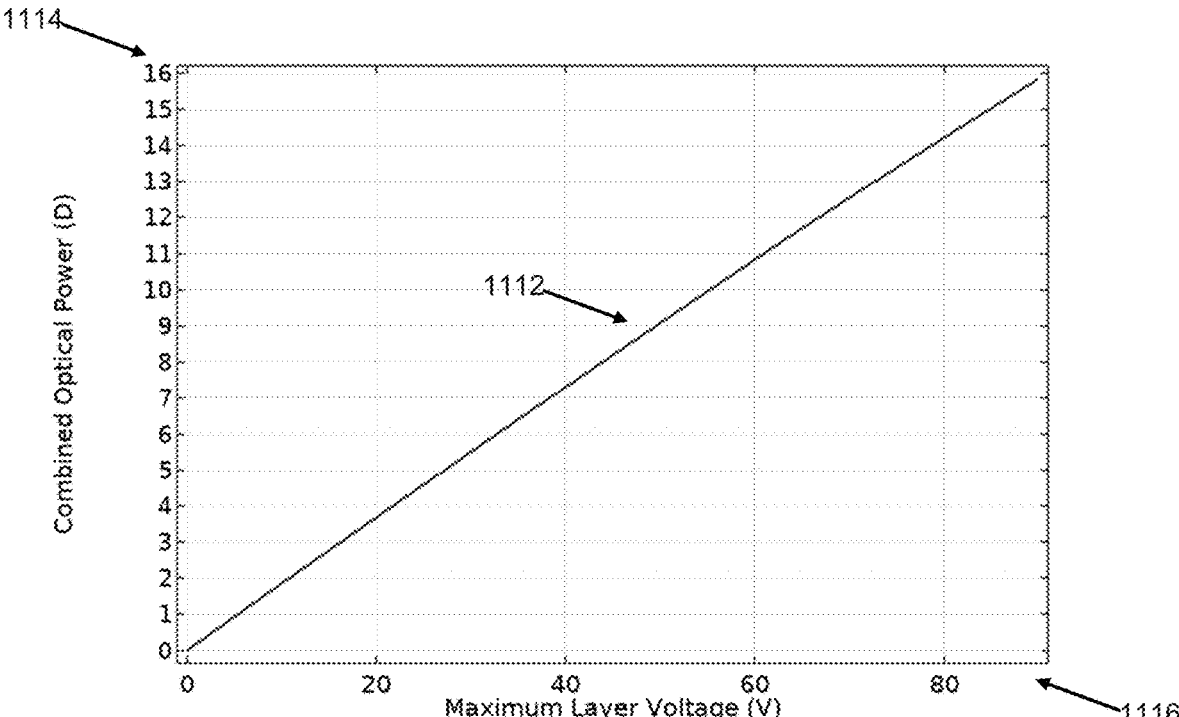
FIG. 11B illustrates voltages required across each layer of a bi-cylindrical piezoelectric actuated lens with ceramic piezoelectric layers to achieve particular levels of combined optical power, according to examples.

FIG. 11B illustrates voltages required across each layer of a bi-cylindrical piezoelectric actuated lens with ceramic piezoelectric layers to achieve particular levels of combined optical power, according to examples. Diagram 1100B shows an applied voltage vs. attained optical power plot 1112 for a bi-cylindrical piezoelectric actuated lens with ceramic (e.g., lead magnesium niobate-lead titanate (PMN-PT)) active layers across maximum layer voltage axis 1116 and combined optical power axis 1114. The plot 1112 in diagram 1100B may be compared to the plot 1002 in FIG. 10A for a bi-cylindrical piezoelectric actuated lens with polymer (e.g., polyvinylidene fluoride (PVDF)) piezoelectric layers. As plot 1112 indicates, the required voltages for optical power levels similar to those in FIG. 10A may be ten to fifteen times less than those required for polymer active layers.

Figure 12:
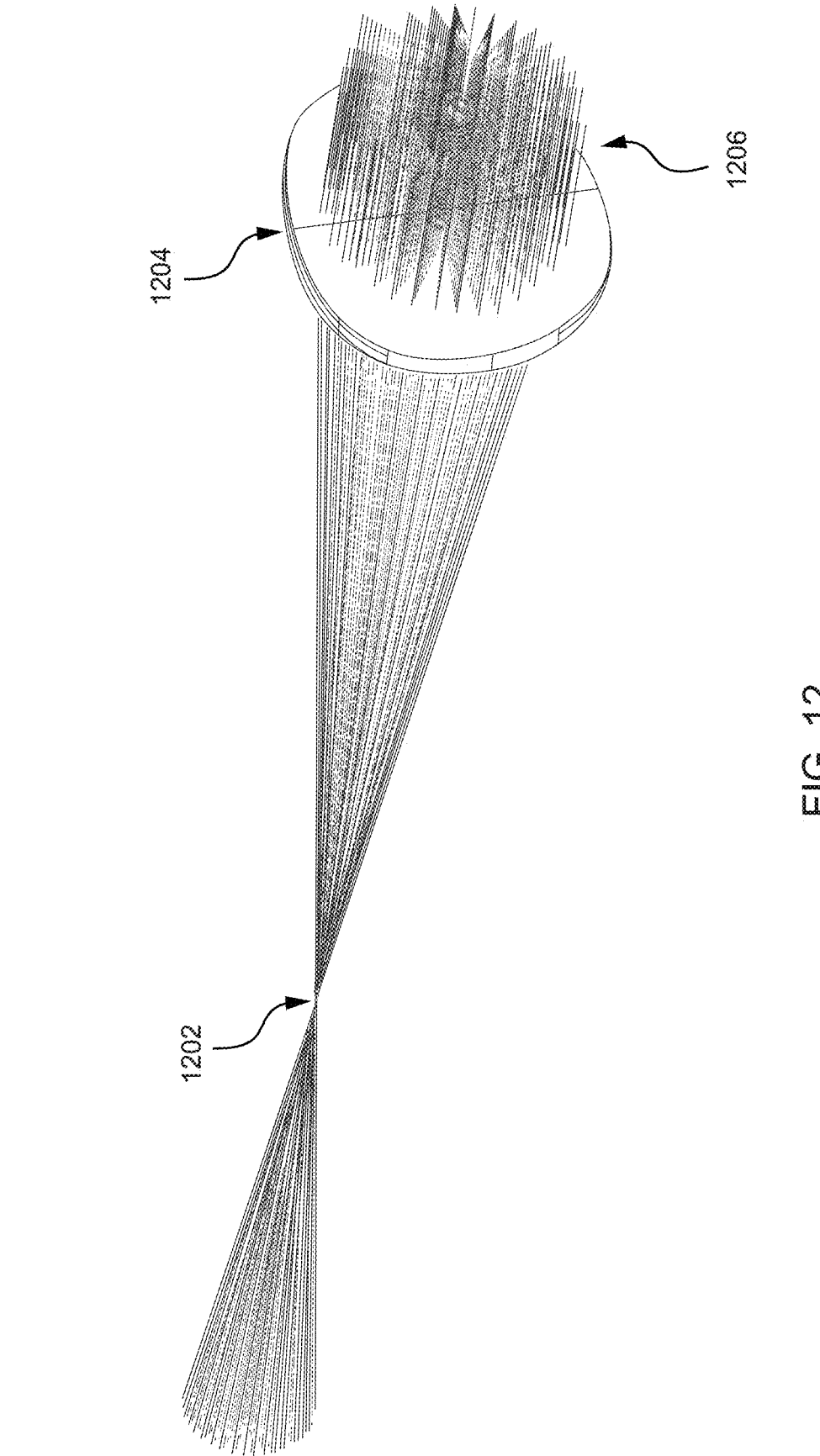
FIG. 12 illustrates a setup of a ray tracing analysis performed on an actuated bi-cylinder deformable lens, according to an example.
Figure 13A:
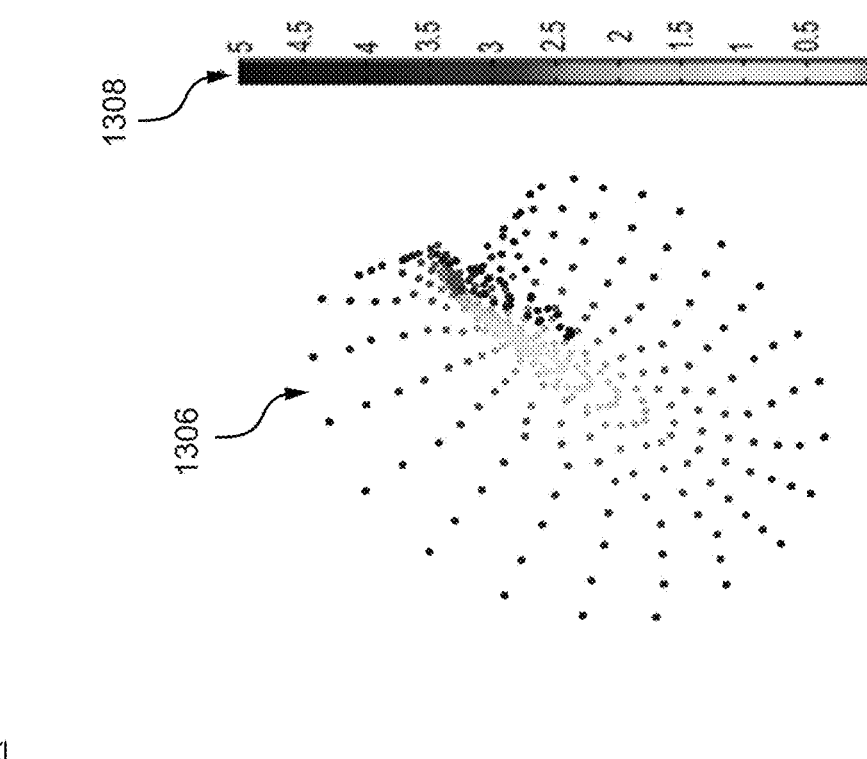
FIGS. 13A-13E illustrate combined spherical deformations and spot diagrams of bi-cylinder liquid lenses and comparable spherical liquid lens with various diopters, according to examples.
Figure 13A:
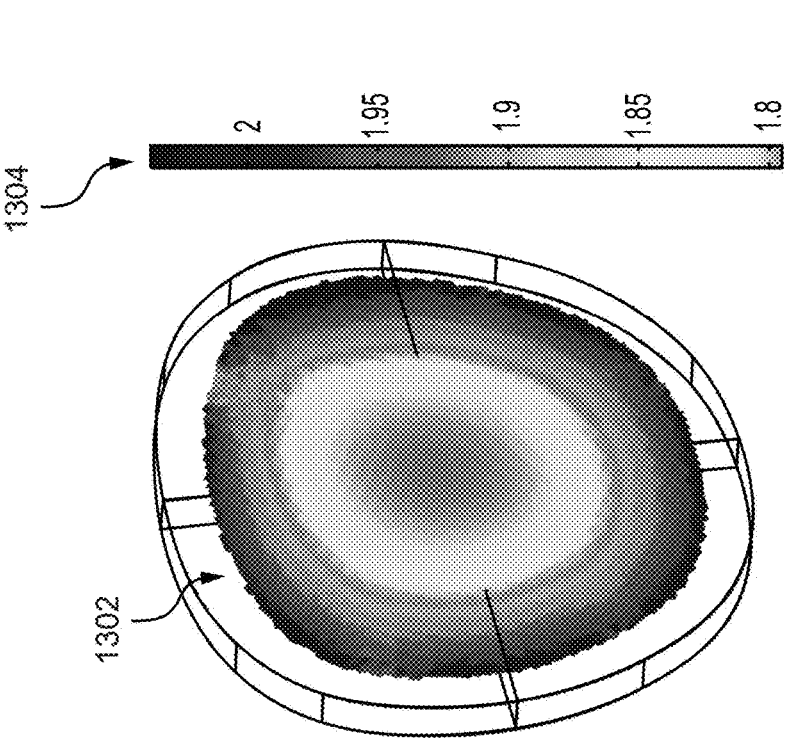
Figure 13B:
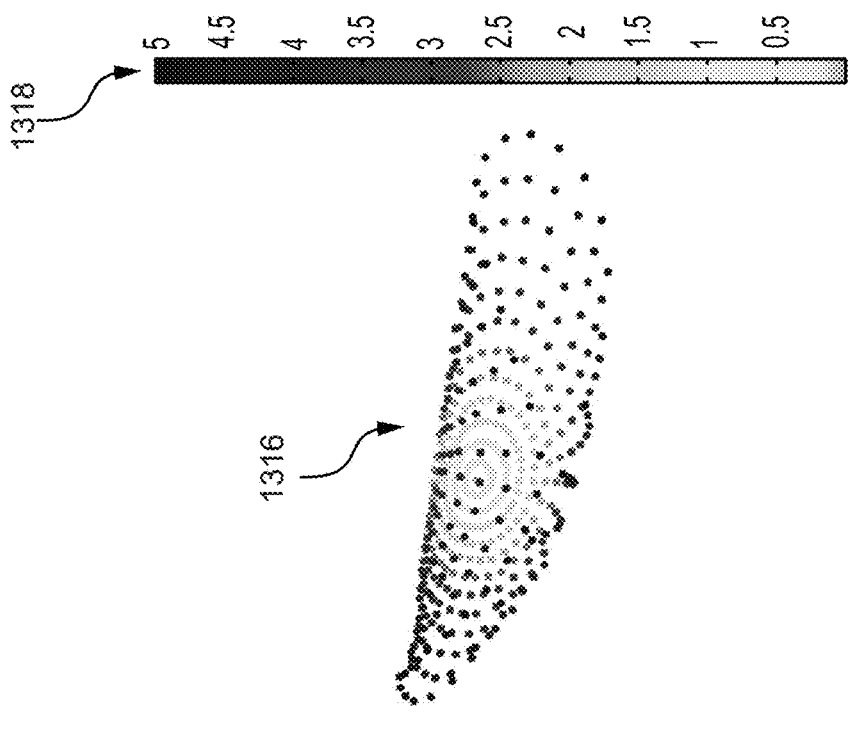
Figure 13B:
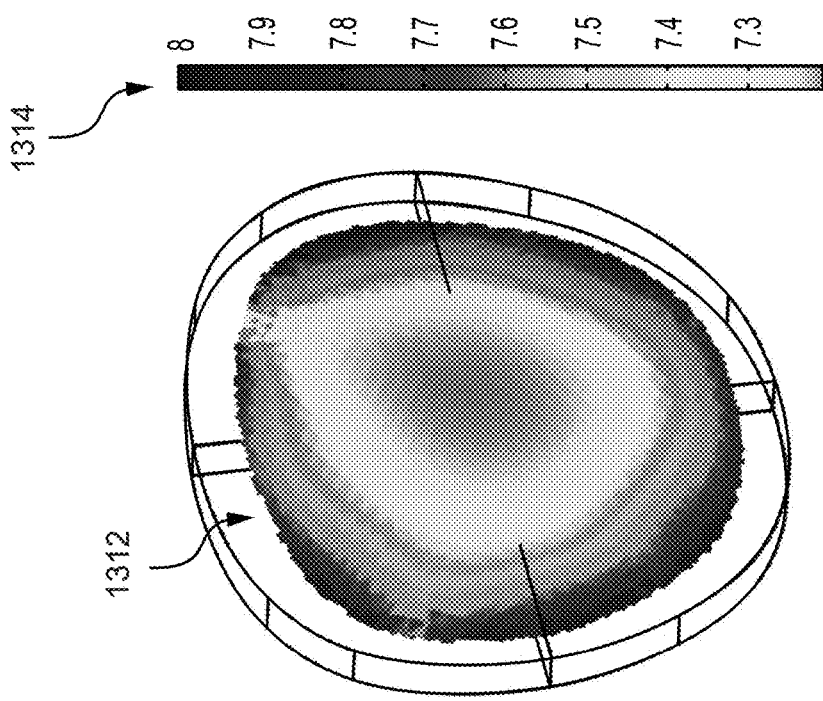
Figure 13C:
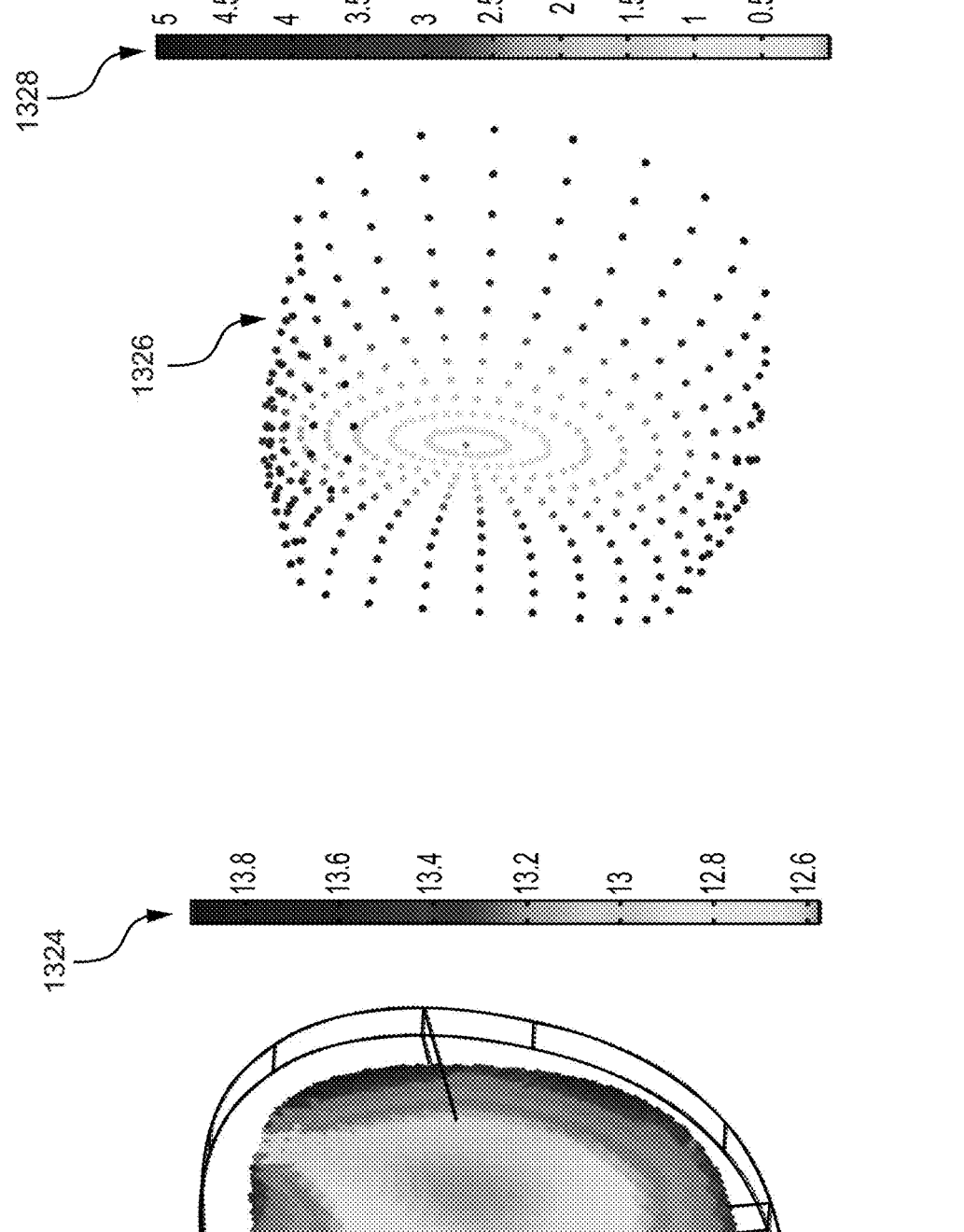
Figure 13D:
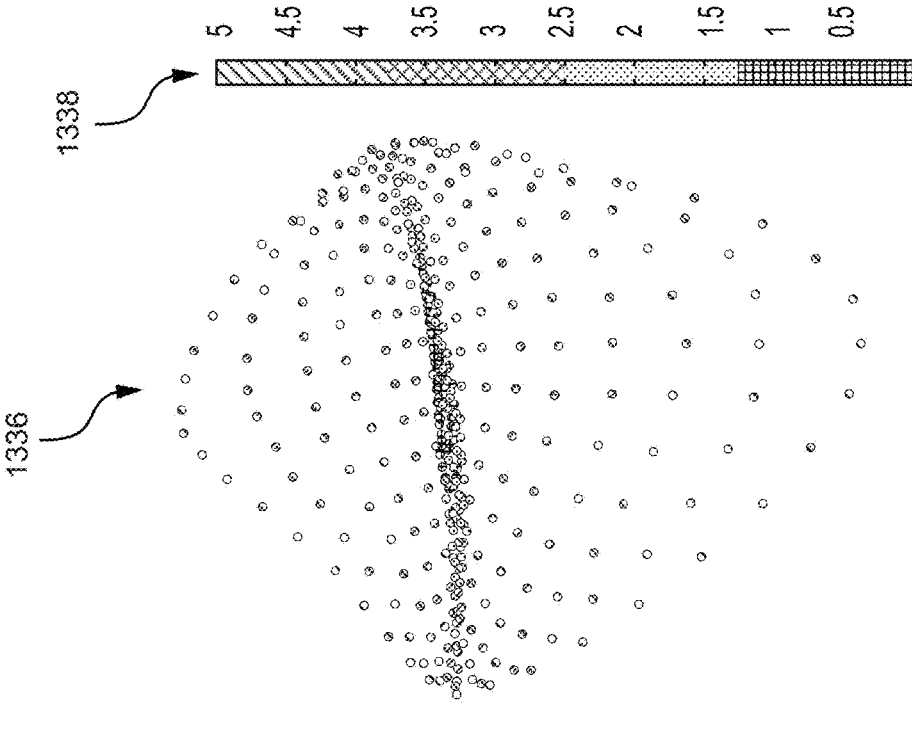
Figure 13D:
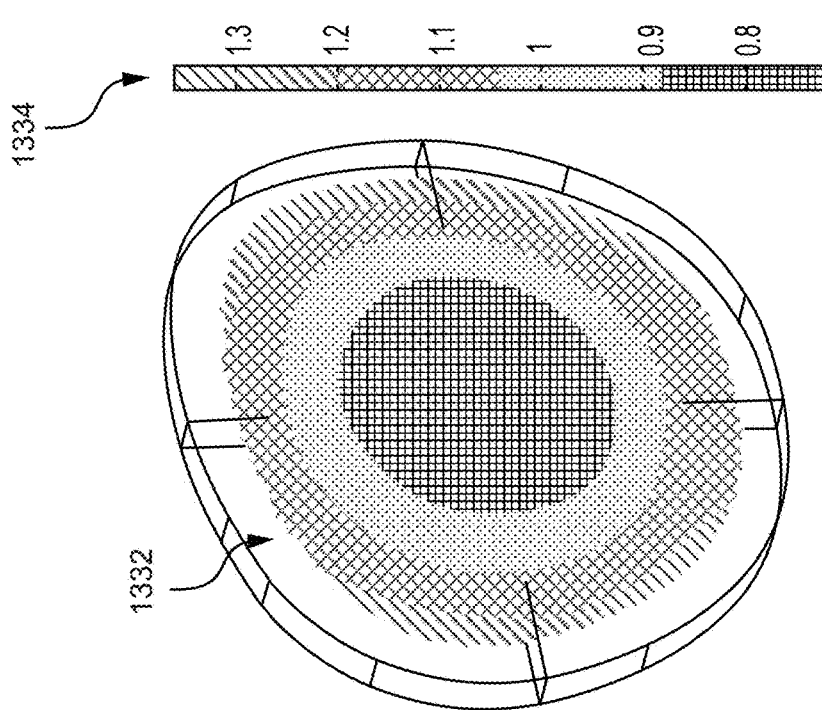
Figure 13E:
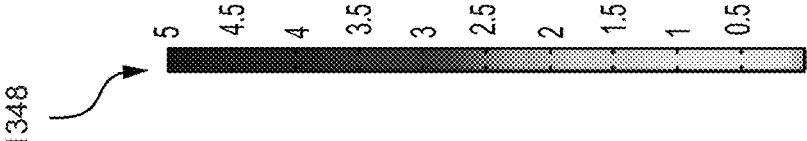
Figure 13E:
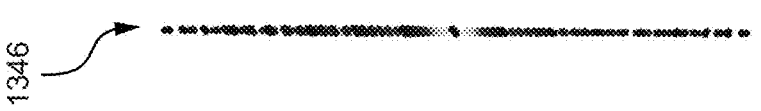
Figure 13E:
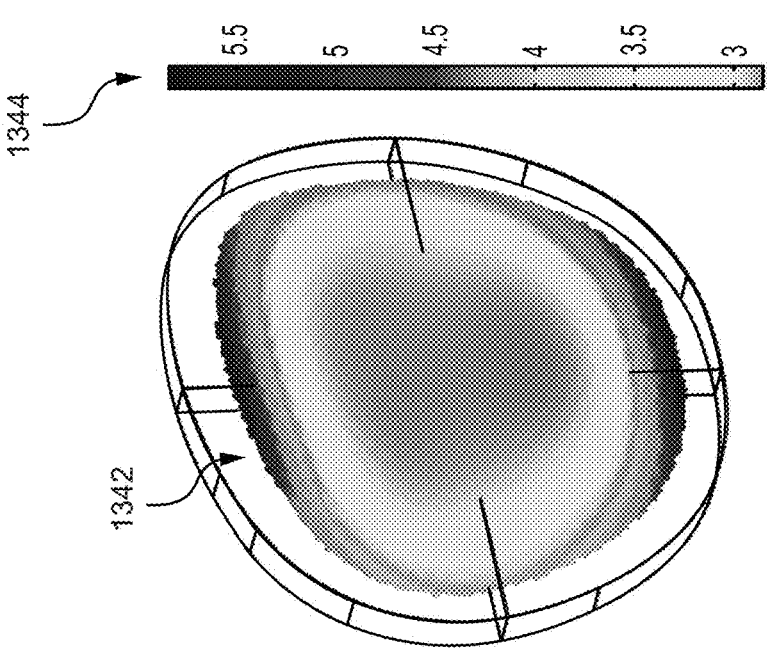

FIG. 12 illustrates a setup of a ray tracing analysis performed on an actuated bi-cylinder deformable lens, according to an example. Diagram 1200 shows a simulated light beam 1206 of radius 5 mm passing through a bi-cylinder deforming liquid lens 1204. The rms radius of the light beam is examined at focal point 1202 to determine optical distortions obtained with the bi-cylinder deformable lens. Examination results for different diopters are shown and discussed in FIGS. 13A-13E.

FIGS. 13A-13E illustrate combined spherical deformations and spot diagrams of bi-cylinder liquid lenses with various diopters, according to examples. Diagram 1300A shows combined spherical deformation 1302 of a bi-cylinder liquid lens actuated to about 1.9 diopters as shown on the optical power scale 1304. Diagram 1300A also includes a spot diagram 1306 for the same lens with a rms radius of 15.5 um, where the rays are colored by their initial ray radius shown on scale 1308 in mm.

Diagram 1300B shows combined spherical deformation 1312 of the same bi-cylinder liquid lens actuated to about 7.6 diopters as shown on the optical power scale 1314. Diagram 13006 also includes the corresponding spot diagram 1316 for the same lens with a rms radius of 28.8 um (initial ray radius shown on scale 1318), which is still relatively small for a relatively high diopter.

Diagram 1300C shows combined spherical deformation 1322 of the same bi-cylinder liquid lens actuated to about 13.2 diopters as shown on the optical power scale 1324. Diagram 1300C also includes the corresponding spot diagram 1326 for the same lens with a rms radius of 48.5 um (initial ray radius shown on scale 1328).

Diagram 1300D shows for comparison purposes spherical deformation 1332 of a spherical liquid lens actuated close to its limit of stability of 1.0 diopters as shown on the optical power scale 1334. Diagram 1300D also includes the corresponding spot diagram 1336 for the same lens with a rms radius of 123 um (initial ray radius scale 1338) indicating relatively higher optical distortion compared to the bi-cylinder liquid lens.

Diagram 1300E shows for comparison purposes spherical deformation 1342 of the same spherical liquid lens actuated beyond its stable range, to an optical power of 4 diopters as shown on the optical power scale 1344. Diagram 1300E also includes the corresponding spot diagram 1346 for the same lens with a rms radius of higher than 2 mm (initial ray radius shown on scale 1348) indicating relatively high optical distortion compared to the bi-cylinder liquid lens due to lack of optical focus along the vertical axis.

Figure 14:
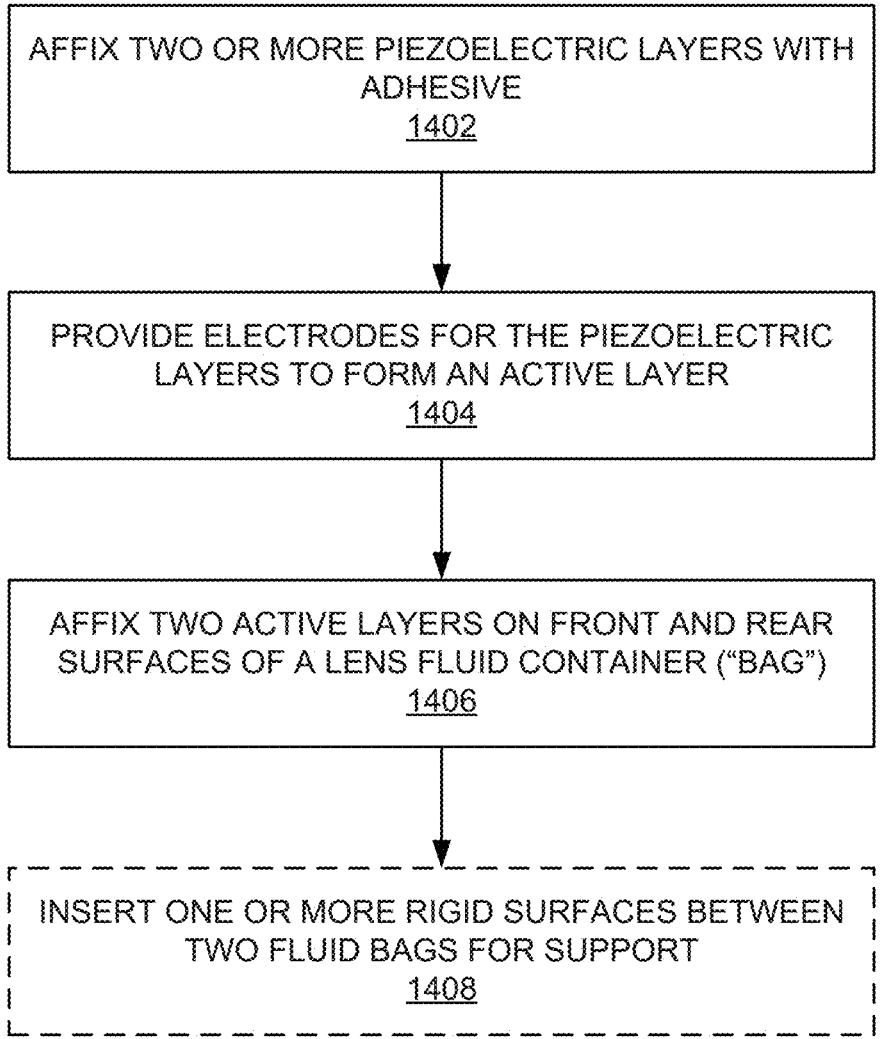
FIG. 14 illustrates a flow diagram for a method of providing bi-cylindrical piezoelectric actuated lens, according to some examples.

FIG. 14 illustrates a flow diagram for a method 1400 of providing a bi-cylindrical piezoelectric actuated lens, according to some examples. The method 1400 is provided by way of example, as there may be a variety of ways to carry out the method described herein. Although the method 1400 is primarily described as being performed to provide the components of FIGS. 5A-5C and 7, the method 1400 may be executed or otherwise performed by one or more processing components of a system or a combination of systems. Each block shown in FIG. 14 may further represent one or more processes, methods, or subroutines, and one or more of the blocks (e.g., the selection process) may include machine readable instructions stored on a non-transitory computer readable medium and executed by a processor or other type of processing circuit to perform one or more operations described herein.

At block 1402, two or more piezoelectric layers may be affixed together with a flexible, transparent adhesive such as an acrylate. The piezoelectric layers may be polymer or ceramic, and deformable cylindrically along one axis.

At block 1404, electrodes for the piezoelectric layers may be deposited onto the piezoelectric layers. In some examples, two electrodes may be used for each piezoelectric layer. In other examples, a number of electrodes may be reduced by using common electrodes between layers. The piezoelectric layers and their respective electrodes may form an active layer to deform one surface of a bi-cylindrical piezoelectric actuated lens.

At block 1406, two active layers may be affixed to a front and rear surface of a flexible and transparent lens fluid container (also referred to as "bag"). The front and rear active layers may be arranged such that their deformation axes are at a non-parallel orientation. For example, the deformation axes may be orthogonal to each other.

At optional block 1408, one or more internal surfaces may be provided to make a two-part lens. For example, the lens fluid may be contained in two bags and a single internal (transparent) surface may separate the two bags. Alternatively, two internal surfaces in contact with each other may also be used. The fluids in the two bags may be isolated or in contact through the internal surface(s).

While examples are discussed in conjunction with head-mounted display device or near-eye display device implementations, a bi-cylindrical piezoelectric actuated lens as described herein may be implemented in other environments such as machine vision, microscopy applications, measurement and dimensional rendering, unmanned aerial vehicle (UAV) based optical systems, and comparable ones using the principles discussed herein. Other applications may include any variable focus optical device such as variable focus cameras, and variable focus glasses.

According to examples, a method of making a bi-cylindrical piezoelectric actuated lens is described herein. A system of making a bi-cylindrical piezoelectric actuated lens is also described herein. A non-transitory computer-readable storage medium may have an executable stored thereon, which when executed instructs a processor to perform the methods described herein.

In the foregoing description, various examples are described, including devices, systems, methods, and the like. For the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples.

The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

Although the methods and systems as described herein may be directed mainly to digital content, such as videos or interactive media, it should be appreciated that the methods and systems as described herein may be used for other types of content or scenarios as well. Other applications or uses of the methods and systems as described herein may also include social networking, marketing, content-based recommendation engines, and/or other types of knowledge or data-driven systems.

The invention claimed is:

1. A transformable optical lens, comprising:
a fluid layer; and
two transparent active layers surrounding the fluid layer on opposite surfaces and each transparent active layer comprising:
one or more cylindrically deformable piezoelectric layers; and
electrodes for the piezoelectric layers, wherein deformation axes of the two transparent active layers are at a non-parallel angle to each other, and wherein each transparent active layer comprises two or more cylindrically deformable piezoelectric layers affixed together by one or more adhesive layers.

2. The transformable optical lens of claim 1, wherein each piezoelectric layer comprises an isotropic polymer layer.

3. The transformable optical lens of claim 2, wherein the polymer layer has a near-zero or zero piezoelectric coupling factor d32.

4. The transformable optical lens of claim 1, wherein the piezoelectric layers comprise an anisotropic ceramic layer.

5. The transformable optical lens of claim 4, wherein the piezoelectric layers comprise two ceramic layers with equal and opposite signed piezoelectric coupling factors d32 to achieve a near-zero or zero combined piezoelectric coupling factor.

6. The transformable optical lens of claim 1, wherein the deformation axes of the two transparent active layers are orthogonal to each other.

7. The transformable optical lens of claim 1, wherein an initial state of the transformable optical lens is flat or curved.

8. The transformable optical lens of claim 1, wherein the two transparent active layers are arranged to introduce a-cylinder deformation to reduce an optical distortion.

9. The transformable optical lens of claim 1, wherein each of the two transparent active layers are arranged to introduce a non-zero spherical deformation that is smaller in magnitude than a cylindrical deformation.

10. The transformable optical lens of claim 1, wherein the two transparent active layers are arranged to introduce a non-zero net cylindrical deformation, in addition to a net spherical deformation.

11. The transformable optical lens of claim 1, wherein a voltage applied to each piezoelectric layer is distinct from voltages applied to other piezoelectric layers.

12. The transformable optical lens of claim 1, wherein a profile of a voltage application to each piezoelectric layer is time varying, and the profile of the voltage is selected based on one or more of a user discomfort level, a user age, or a user lens prescription.

13. A transformable optical lens, comprising:
two fluid layers;
one or more transparent internal layers separating the two fluid layers; and
two transparent active layers surrounding outside surfaces of the two fluid layers and each transparent active layer comprising:
two or more cylindrically deformable piezoelectric layers affixed together by one or more adhesive layers; and
electrodes for the piezoelectric layers, wherein deformation axes of the two transparent active layers are at a non-parallel angle to each other.

14. The transformable optical lens of claim 13, wherein the two fluid layers are in fluidic contact with each other through the one or more internal layers.

15. The transformable optical lens of claim 13, wherein the two or more piezoelectric layers comprise:
an isotropic polymer layer with a near-zero or zero piezoelectric coupling factor d32; or
an anisotropic ceramic layer with equal and opposite signed piezoelectric coupling factors d32 to achieve a near-zero or zero combined piezoelectric coupling factor.

16. The transformable optical lens of claim 13, wherein the deformation axes of the two transparent active layers are orthogonal to each other, or the two transparent active layers are made from different materials.

17. A method, comprising:
attaching two or more cylindrically deformable piezoelectric layers and respective electrodes for the piezoelectric layers together with one or more adhesive layers to form two transparent active layers; and
attaching the two transparent active layers to opposite surfaces of a lens fluid container to form a transformable optical lens, wherein deformation axes of the two transparent active layers are at a non-parallel angle to each other.

18. The method of claim 17, further comprising:
arranging the deformation axes of the two transparent active layers orthogonal to each other.

19. The method of claim 17, further comprising:
setting an initial state of the transformable optical lens to flat or curved.

* * * * *